United States Patent
Nishikawa et al.

(10) Patent No.: US 8,144,140 B2
(45) Date of Patent: Mar. 27, 2012

(54) DISPLAY APPARATUS AND METHOD OF MANUFACTURING THE SAME

(75) Inventors: Tomotaka Nishikawa, Aichi (JP); Shinichiro Morikawa, Aichi (JP)

(73) Assignee: Sony Corporation, Tokyo (JP)

( * ) Notice: Subject to any disclaimer, the term of this patent is extended or adjusted under 35 U.S.C. 154(b) by 961 days.

(21) Appl. No.: 12/135,620

(22) Filed: Jun. 9, 2008

(65) Prior Publication Data
US 2008/0309650 A1    Dec. 18, 2008

(51) Int. Cl.
*G09G 5/00* (2006.01)
(52) U.S. Cl. ........................................ 345/206
(58) Field of Classification Search ........... 257/59; 345/206
See application file for complete search history.

(56) References Cited

U.S. PATENT DOCUMENTS
2007/0075313 A1*  4/2007  Kwak et al. ............... 257/59

FOREIGN PATENT DOCUMENTS

| JP | 57-061243 | 4/1982 |
|----|-----------|--------|
| JP | 01-281432 | 11/1989 |
| JP | 1997-033933 | 2/1997 |
| JP | 11-142871 | 5/1999 |
| JP | 2000-347173 | 12/2000 |
| JP | 2005-038633 | 2/2005 |
| JP | 2006-178368 | 7/2006 |

OTHER PUBLICATIONS

Japanese Patent Office Action corresponding to JP Ser. No. 2007-170145 dated Jul. 7, 2009.

\* cited by examiner

*Primary Examiner* — Quan-Zhen Wang
*Assistant Examiner* — Tony Davis
(74) *Attorney, Agent, or Firm* — SNR Denton US LLP

(57) ABSTRACT

A display apparatus has a driving panel including a circuit part, a coating layer, and a display part, provided sequentially over a driving substrate. The driving panel includes: an adhesion region which includes the circuit part, the coating layer and the display part and to which a seal panel is adhered through an adhesive layer therebetween; and a terminal region protruding from the seal panel and the adhesive layer. A plurality of metallic wires electrically connected to the circuit part in the adhesion region are extended into the terminal region, and the coating layer is provided in the adhesion region with at least one separated region between the plurality of metallic wires. The separated region of the coating layer is so formed that an end edge thereof lies beyond the adhesion region to reach the terminal region but not to reach an end edge of the terminal region.

14 Claims, 26 Drawing Sheets

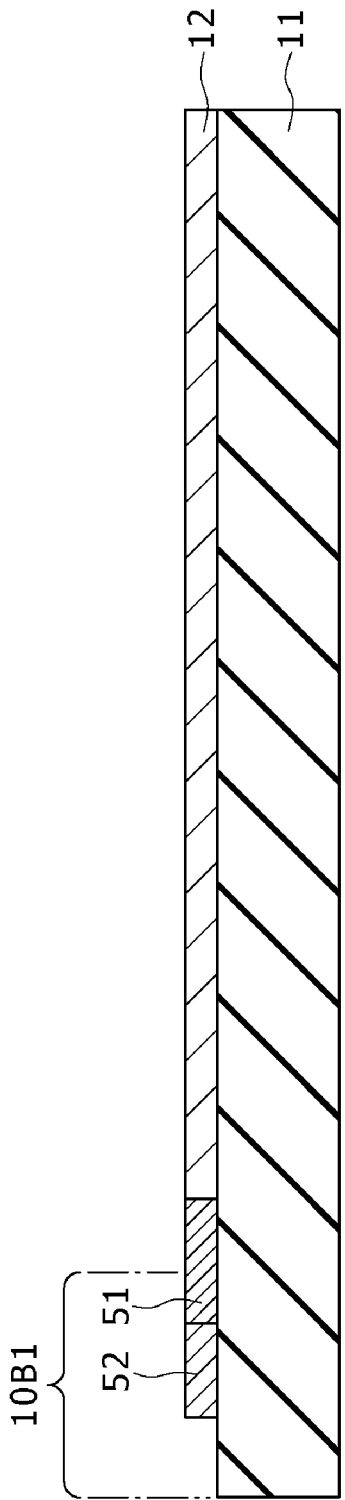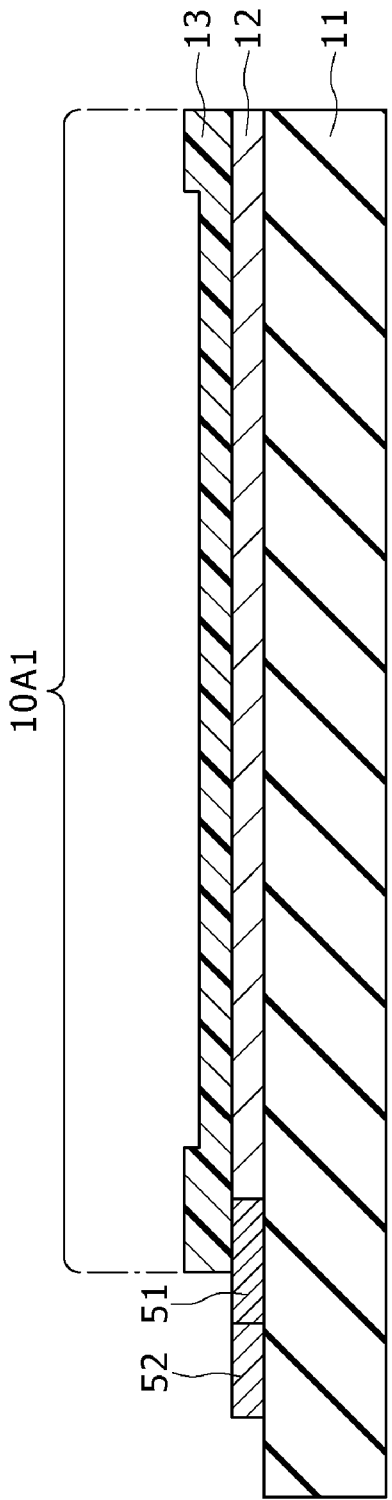

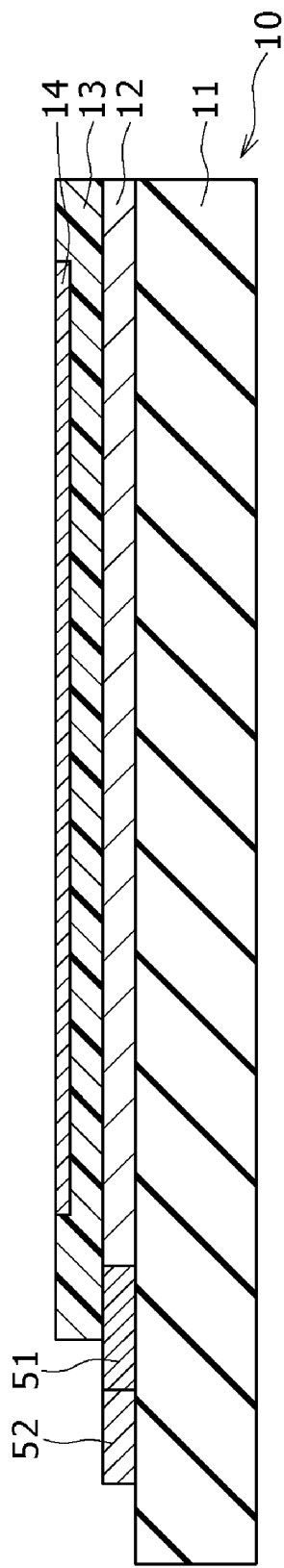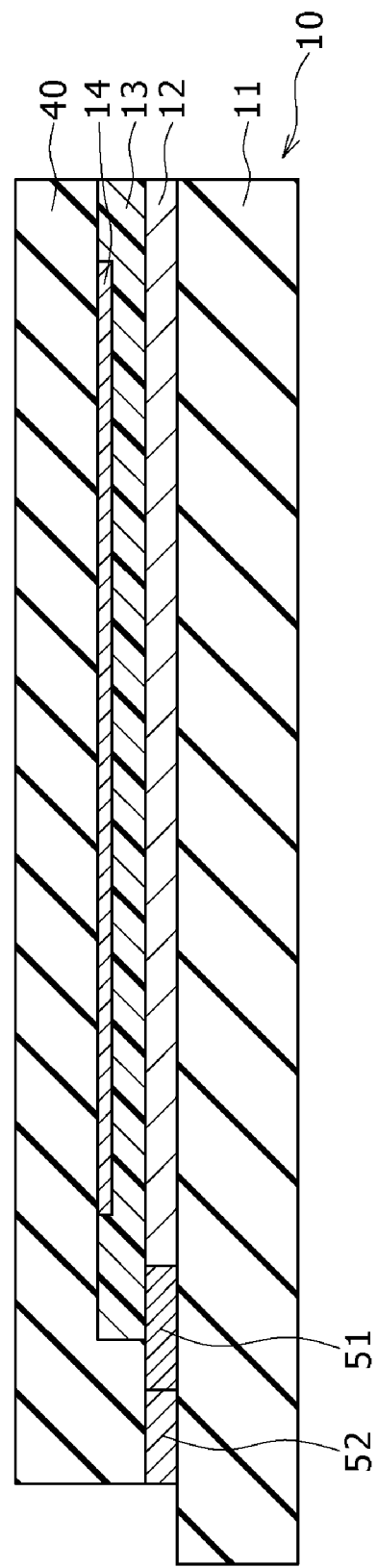

FIG.15
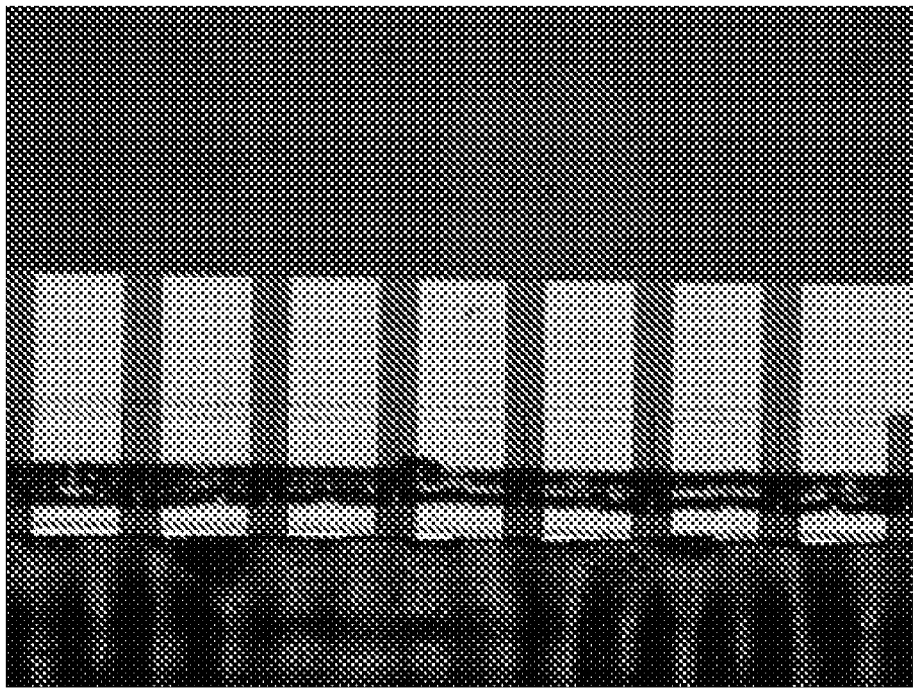
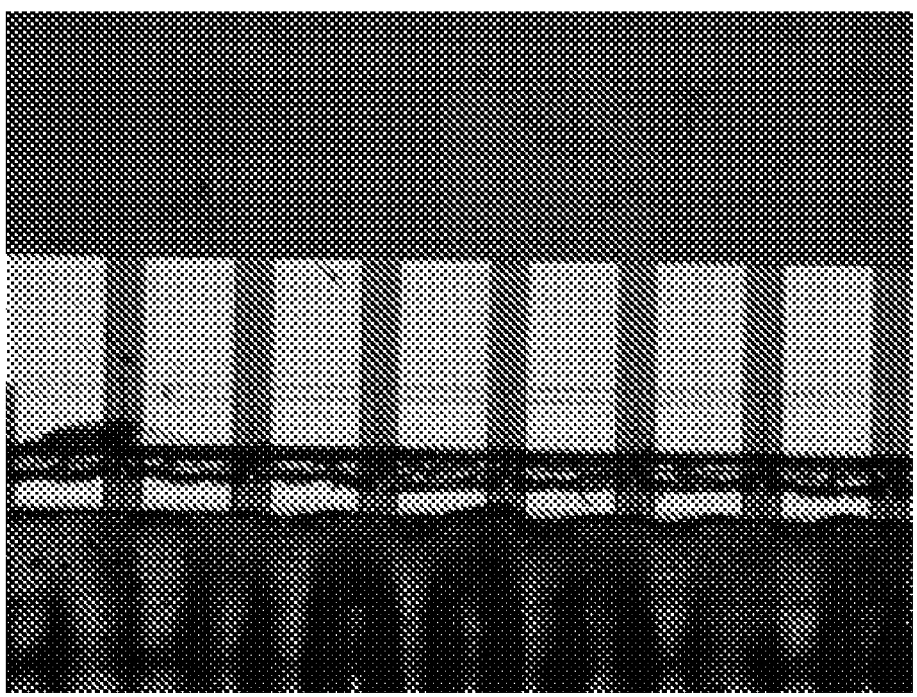

FIG.16
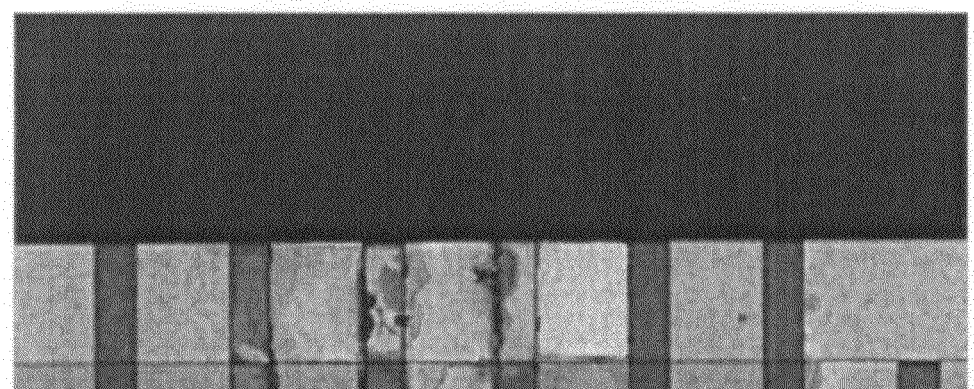
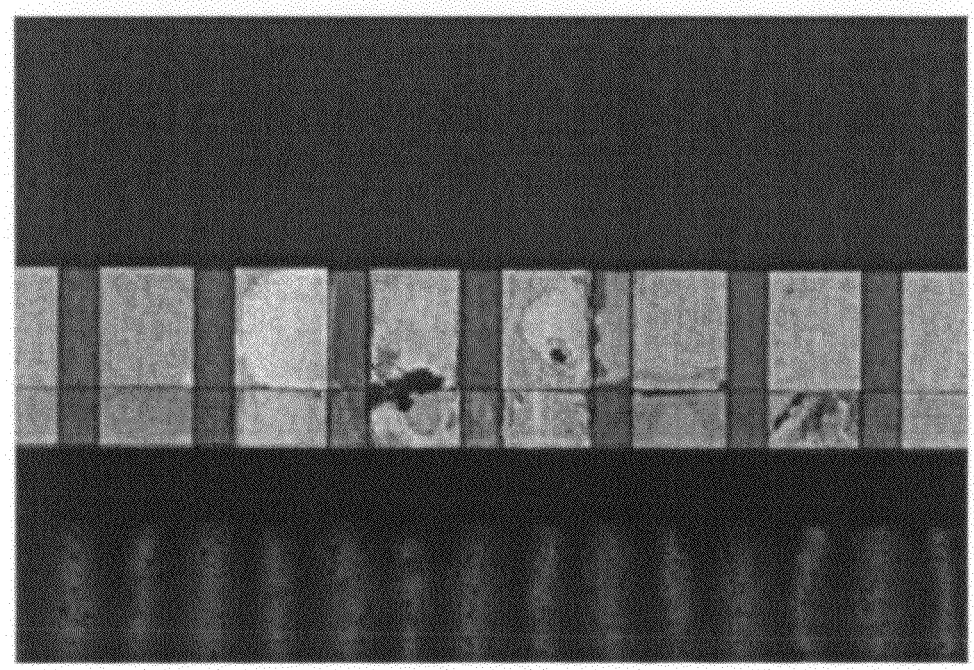

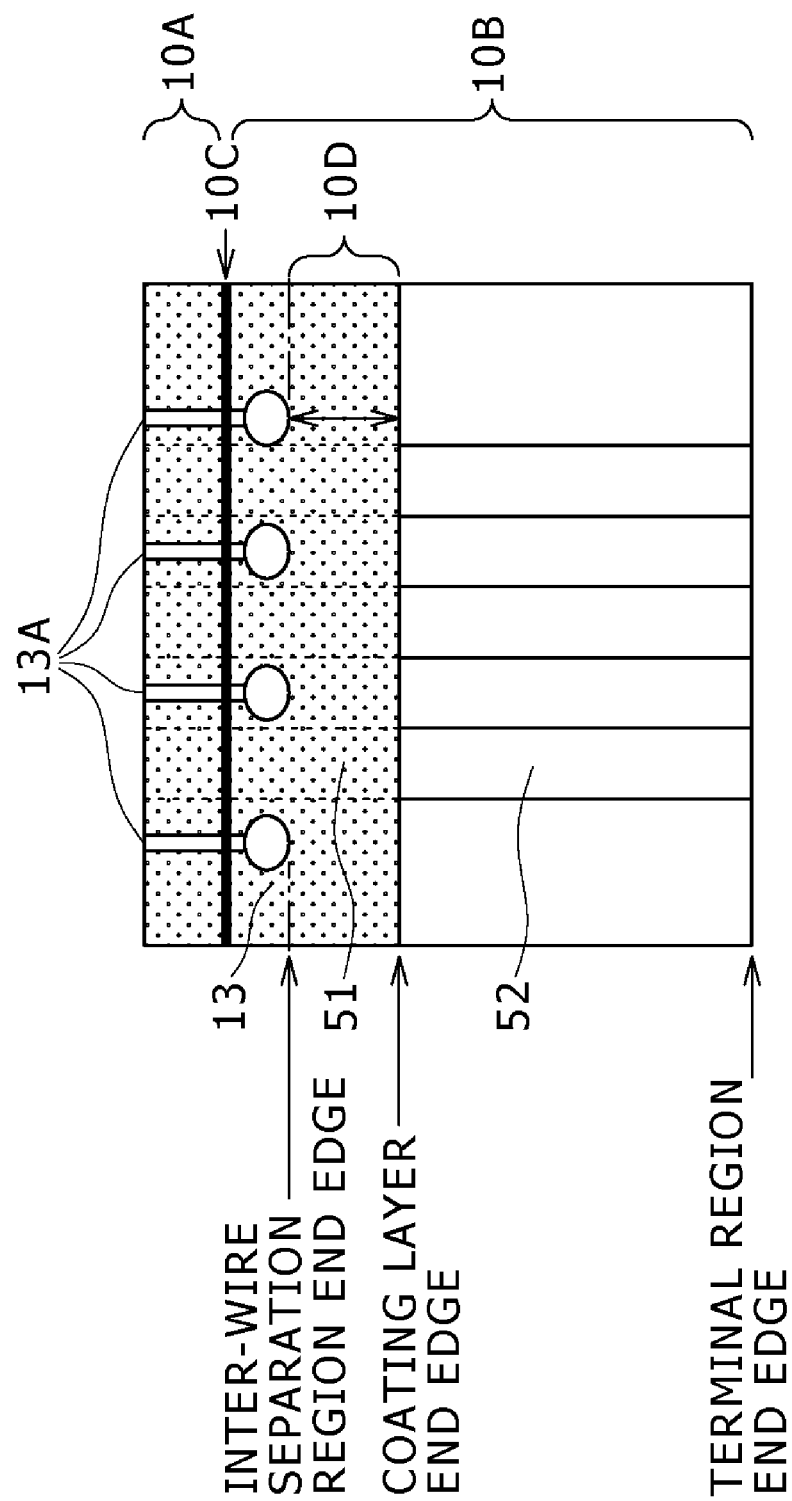

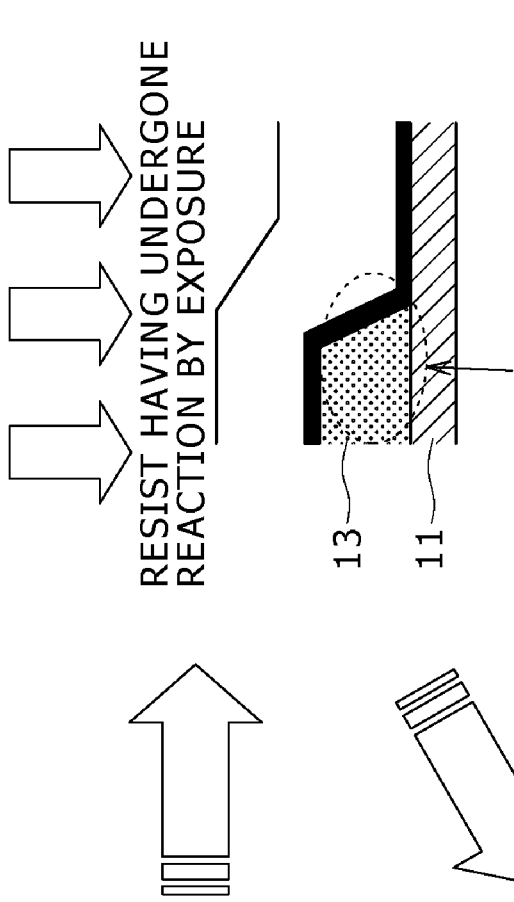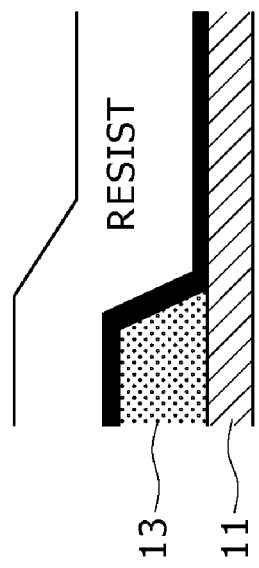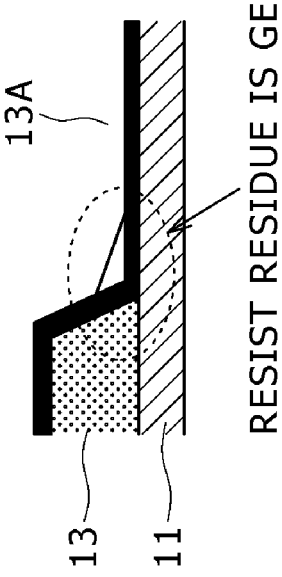

DISPLAY APPARATUS AND METHOD OF MANUFACTURING THE SAME

CROSS REFERENCES TO RELATED APPLICATIONS

The present invention contains subject matter related to Japanese Patent Application JP 2007-170145 filed in the Japan Patent Office on Jun. 28, 2007, and Japanese Patent Application JP 2007-156535 filed in the Japan Patent Office on Jun. 13, 2007, the entire contents of which being incorporated herein by reference.

BACKGROUND OF THE INVENTION

1. Field of the Invention

The present invention relates to a display apparatus using display devices such as organic light emitting devices and a method of manufacturing the same. More particularly, the invention relates to a display apparatus suitably applicable to a so-called fully solid sealed structure in which a driving panel provided with display devices and a seal panel are adhered to each other through an adhesive layer therebetween and a method of manufacturing the same.

2. Description of the Related Art

In recent years, organic light emitting display apparatuses using organic light emitting devices have come to draw attention as display apparatus for substituting for liquid crystal display. FIGS. 22 and 23 illustrate an example of the structure of such an organic light emitting display apparatus. The display apparatus has a configuration in which a driving panel 210 and a seal panel 220 are opposed to each other and are adhered to each other through an adhesive layer 230 therebetween The driving panel 210 has a circuit part 212, a coating layer 213, and a display part 214 including a plurality of organic light emitting devices, which are sequentially formed over a driving substrate 211 including a glass or the like. The seal panel 220 has a sealing substrate 221 including a glass or the like. Between the display part 214 side of the driving panel 210 and the adhesive layer 230, an inorganic insulating film 240 including silicon nitride ($SiN_x$) or silicon dioxide ($SiO_2$) or the like is provided in order to shield the display part 214 from the atmospheric air (refer to, for example, Japanese Patent Laid-open No. 2005-38633).

The circuit part 212, the coating layer 213 and the display part 214 are provided in an adhesion region 200A between the driving panel 210 and the seal panel 220. One edge of the driving panel 210 forms a terminal region 200B protruding from the seal panel 220. Metallic wires 251 are extended from the circuit part 212 into the terminal region 200B, and terminal parts 252 are provided at the tips of the metallic wires 251. The metallic wires 251 and the terminal parts 252 include a low-resistance metal, for example, aluminum (Al).

SUMMARY OF THE INVENTION

In such a display apparatus according to the related art, as shown in FIG. 24, the metallic wires 251 are covered with the continuous coating layer 213 in the adhesion region 200A. Since the coating layer 213 includes an organic insulating material, it is liable to absorb water (moisture), and it is low in adhesion to the inorganic insulating film 240. Therefore, a boundary part 200C between the adhesion region 200A and the terminal region 200B is liable to be influenced by water (moisture) in a high water vapor pressure environment. Thus, water and impurity ions penetrate through the inside of the coating layer 213 or through the interface between the coating layer 213 and the inorganic insulating film 250, and a potential difference generated between the metallic wires 251 causes corrosion of the metallic wires 251, leading to disconnection or short-circuit.

Examples of the cause of galvanic corrosion of the metallic wires 251 include ion exchange paths for ions of the constituent materials of the metallic wires 251, water (moisture), etc. and an electric field generated due to the potential between the adjacent metallic wires 251. In the related art, as for example described in Japanese Patent Laid-open No. Hei 11-142871, a method of minimizing the influence of the potential between the adjacent wires, which is one of the causes of the galvanic corrosion, by setting the arranging order of the wires arrayed in parallel so as to minimize the potential difference between the adjacent wires and, further, by providing a dummy wire or wires. However, in the display apparatus according to the related art as shown in FIG. 24, water (moisture) and impurity ions can freely penetrate into the areas between the metallic wires 251 through the coating layer 213, so that it is difficult to obviate corrosion, even if the potential difference between the adjacent wires is very small.

Accordingly, there is a need for a display apparatus in which corrosion of metallic wires can be restrained and reliability can be enhanced, and a method of manufacturing the same.

In order to fulfill the above need, according to one embodiment of the present invention, there is provided a display apparatus including a driving panel including a circuit part, a coating layer, and a display part having a plurality of display devices, provided sequentially over a driving substrate. In the display apparatus, the driving panel includes: an adhesion region which includes the circuit part, the coating layer and the display part and to which a seal panel is adhered through an adhesive layer therebetween; and a terminal region protruding from the seal panel and the adhesive layer. In the display apparatus, a plurality of metallic wires electrically connected to the circuit part in the adhesion region are extended into the terminal region, and the coating layer is provided in the adhesion region with at least one separated region between the plurality of metallic wires; and the separated region of the coating layer is so formed that an end edge thereof lies beyond the adhesion region to reach the terminal region but not to reach an end edge of the terminal region.

There is also a method of manufacturing a display apparatus including the steps of: providing an adhesion region and a terminal region on a driving panel, forming a circuit part in the adhesion region and forming a plurality of wires extended from the circuit part into the terminal region; and forming a coating layer covering the circuit part so that an end edge thereof does not reach an end edge of the terminal region. The method further includes the step of: providing the coating layer with a separated region between the plurality of wires so that an end edge of the separated region of the coating layer lies beyond the adhesion region to reach the terminal region but not to reach an end edge of the coating layer, thereby forming a flat region in which an upper surface of the coating layer constitutes a flat surface in the array direction of terminals, between the end edge of said separated region of said coating layer and the end edge of the coating layer; and forming a display part over the coating layer in the adhesion region. The method further includes the step of: covering the upper side of the coating layer in the terminal region with a masking tape, and putting said flat surface and the masking tape into full contact with each other; adhering a seal panel to the adhesion region through an adhesive layer therebetween;

and cutting away the seal panel and the adhesive layer in the terminal region and removing the masking tape to thereby expose the wires.

According to the one embodiment of the invention, the coating layer in the adhesion region has a separated region between the plurality of metallic wires, so that penetration of water (moisture) and impurity ions into the areas between the adjacent metallic wires through the coating layer is prevented. Therefore, corrosion of the metallic wires can be restrained, and reliability of the display apparatus can be enhanced drastically. Moreover, since the end edge of the separated region of the coating layer does not reach the end edge of the terminal region, it is ensured that, for example in the case of masking in such a manner as to prevent the adhesive layer from protruding into the terminal region, a flat region (full contact region) for the masking can be secured in the range to the end edge of the terminal region. Therefore, through the enhanced assuredness of the masking, the adhesive layer can be securely prevented from protruding into the terminal region. As a result, the reliability and the manufacturing yield of the display apparatus can be enhanced.

BRIEF DESCRIPTION OF THE DRAWINGS

These and other objects of the invention will be seen by reference to description, taken in connection with the accompanying drawing, in which:

FIGS. 6A to 6F are figures illustrating a method of manufacturing the display apparatus shown in FIG. 1, in the order of steps;

FIG. 15 shows photographs showing the results of an embodiment of the invention;

FIG. 16 shows photographs showing the results of a comparative example;

FIG. 18 is a plan view showing in an enlarged form a part in the vicinity of a boundary part of a display apparatus according to a fourth embodiment of the invention;

FIGS. 19A to 19C are sectional views illustrating the outline of generation of resist residue in the vicinity of an end edge of the inter-wire separation region;

DETAILED DESCRIPTION OF THE PREFERRED EMBODIMENTS

Figure 1:
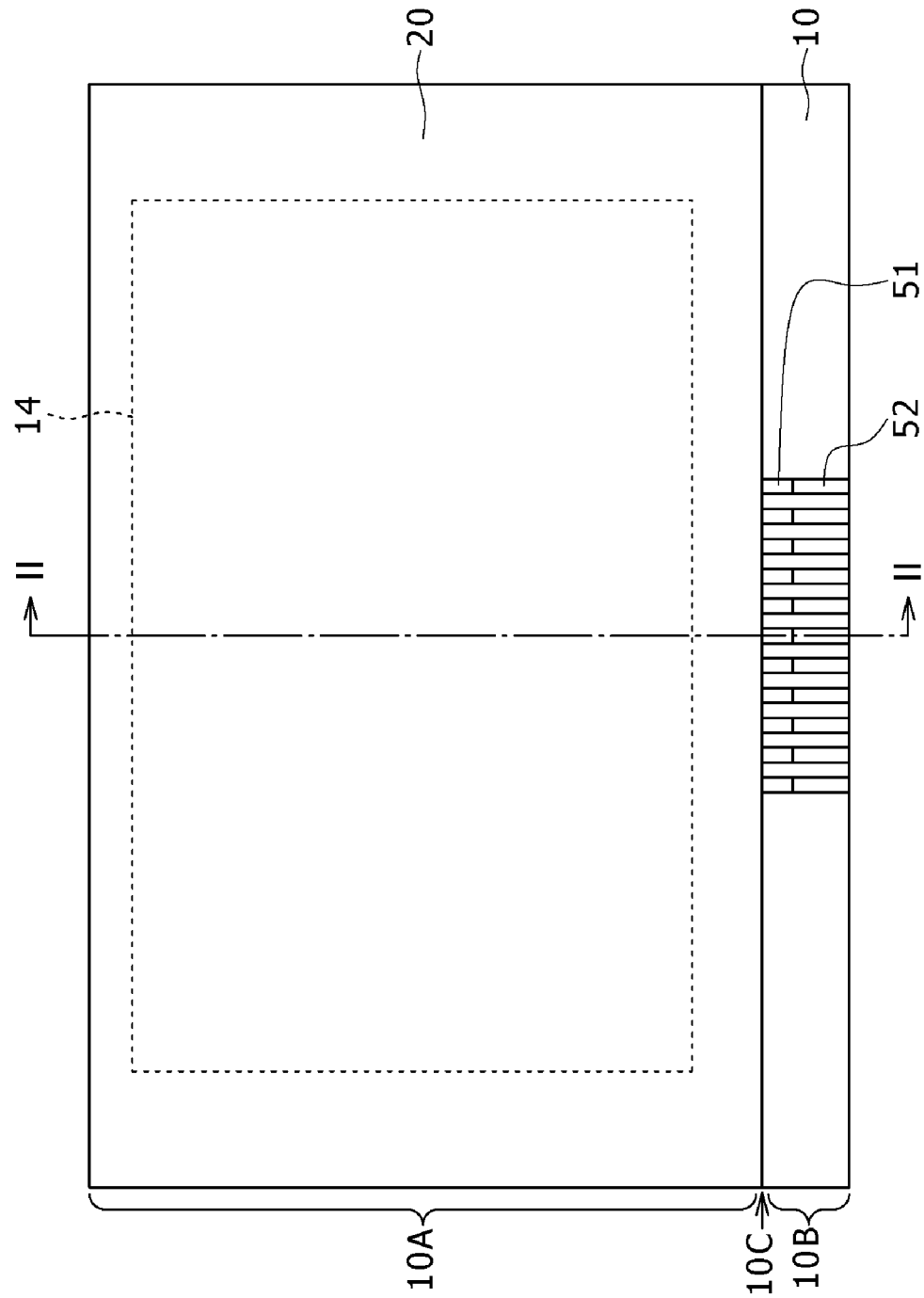
FIG. 1 is a plan view showing a general configuration of a display apparatus according to a first embodiment of the present invention.

Now, embodiments of the present invention will be described in detail below, referring to the drawings. In the drawings, the component elements are schematically shown in such shapes, sizes and positional relationships as to permit the viewer to understand the invention, and their dimensions shown are different from the actual dimensions.

First Embodiment

Figure 2:
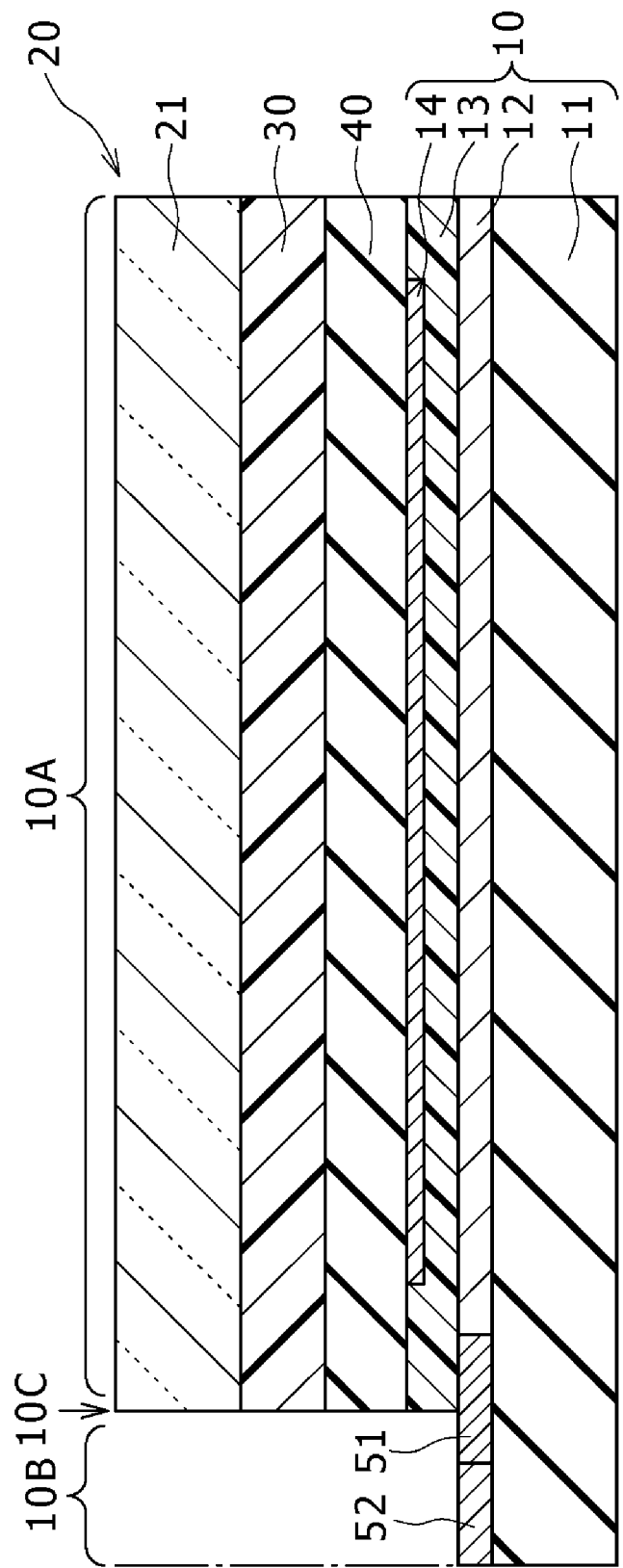
FIG. 2 is a sectional view taken along line II-II of FIG. 1, of the display apparatus shown in FIG. 1.

FIG. 1 illustrates a general structure of a display apparatus according to a first embodiment of the present invention, and FIG. 2 illustrates a sectional structure at line II-II of the display apparatus shown in FIG. 1. The display apparatus is one used, for example, an active or passive type very thin organic light emitting display apparatus driven by thin film transistors (TFTs), and has a configuration in which a driving panel 10 and a seal panel 20 are opposed to each other and adhered to each other through an adhesive layer 30 therebetween.

The driving panel 10 has a circuit part 12, a coating layer 13, and a display part 14 including a plurality of organic light emitting devices described later, which are sequentially formed over a driving substrate 11 including an inorganic insulating material such as a glass. Between the display part 14 side of the driving panel 10 and the adhesive layer 30, an inorganic insulating film 40 including silicon nitride ($SiN_x$) or silicon dioxide ($SiO_2$) is provided for shielding the display part 14 from the atmospheric air.

The circuit part 12 includes a driving circuit (not shown) including TFTs or the like for driving the organic light emitting devices of the display part 14, and a peripheral circuit (not shown) provided in the periphery of the display part 14.

The coating layer 13 has a thickness of, for example, 0.2 to 50 μm, and includes an organic photosensitive material such as polyimide, polyamide, acrylic resin, BCB (benzocyclobutene), and polyimide-amide.

The circuit part 12, the coating layer 13 and the display part 14 are provided in an adhesion region 10A where the driving panel 10 and the seal panel 20 are adhered to each other. One edge of the driving panel 10 forms a terminal region 10B protruding from the seal panel 20. A plurality of metallic wires 51 electrically connected to a peripheral circuit, of the circuit part 12, are extended into the terminal region 10B, and terminal parts 52 are provided at the tips of the metallic wires 51. Each of the metallic wires 51 preferably includes a material having a low resistance and excellent reflectance and processability, has a thickness of, for example, about 50 nm to 5 μm, and preferably includes aluminum (Al) or an alloy containing aluminum (Al). Specific examples of the alloy include alloys of aluminum (Al) with titanium (Ti), silicon (Si), molybdenum (Mo), copper (Cu), chromium (Cr), nickel (Ni), palladium (Pd), platinum (Pt), tungsten (W) or the like. Besides, a laminate structure of these materials may be adopted.

Figure 3:
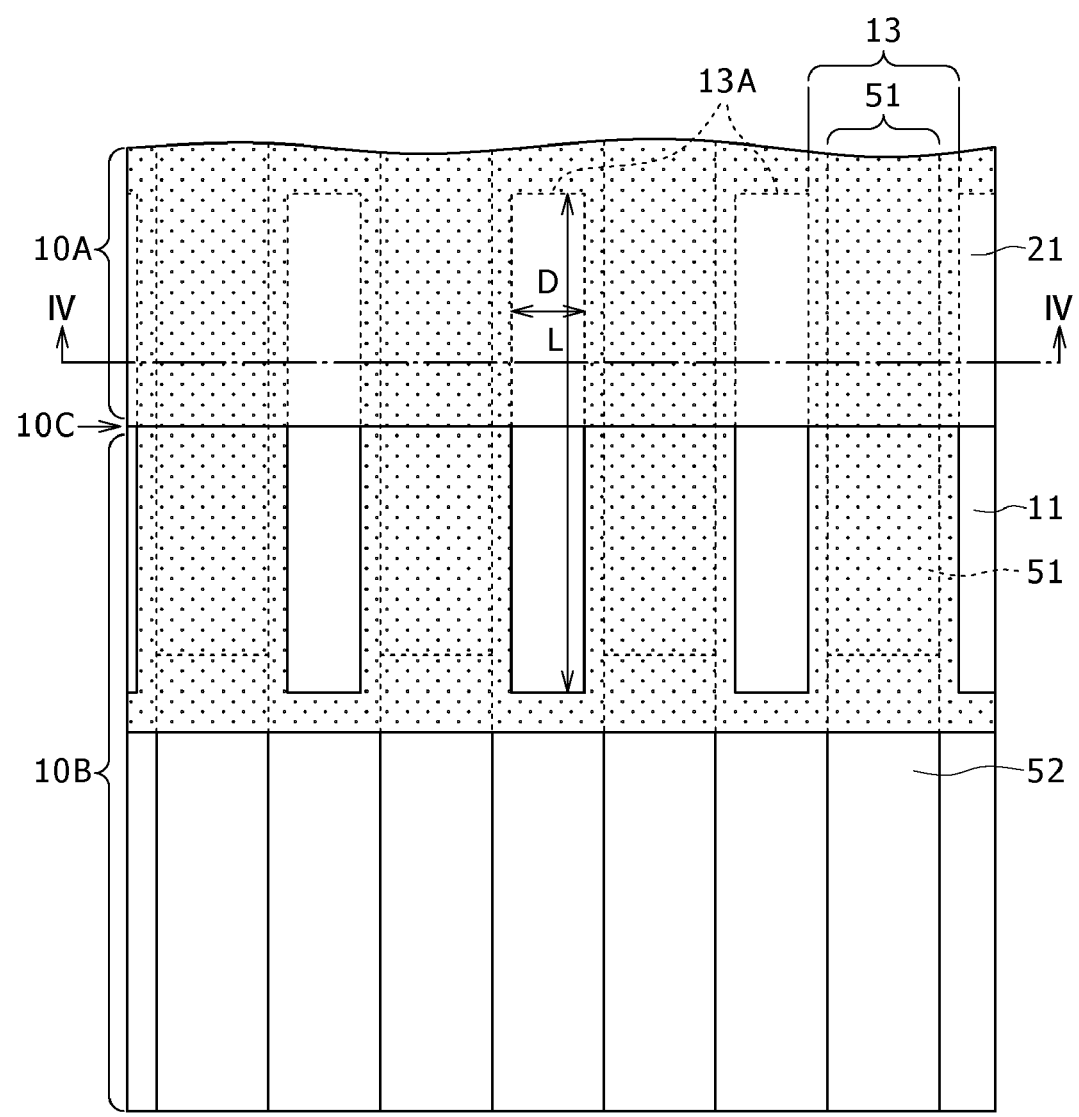
FIG. 3 is a plan view showing in an enlarged form a part in the vicinity of a boundary part of the display apparatus shown in FIG. 1.
Figure 4:
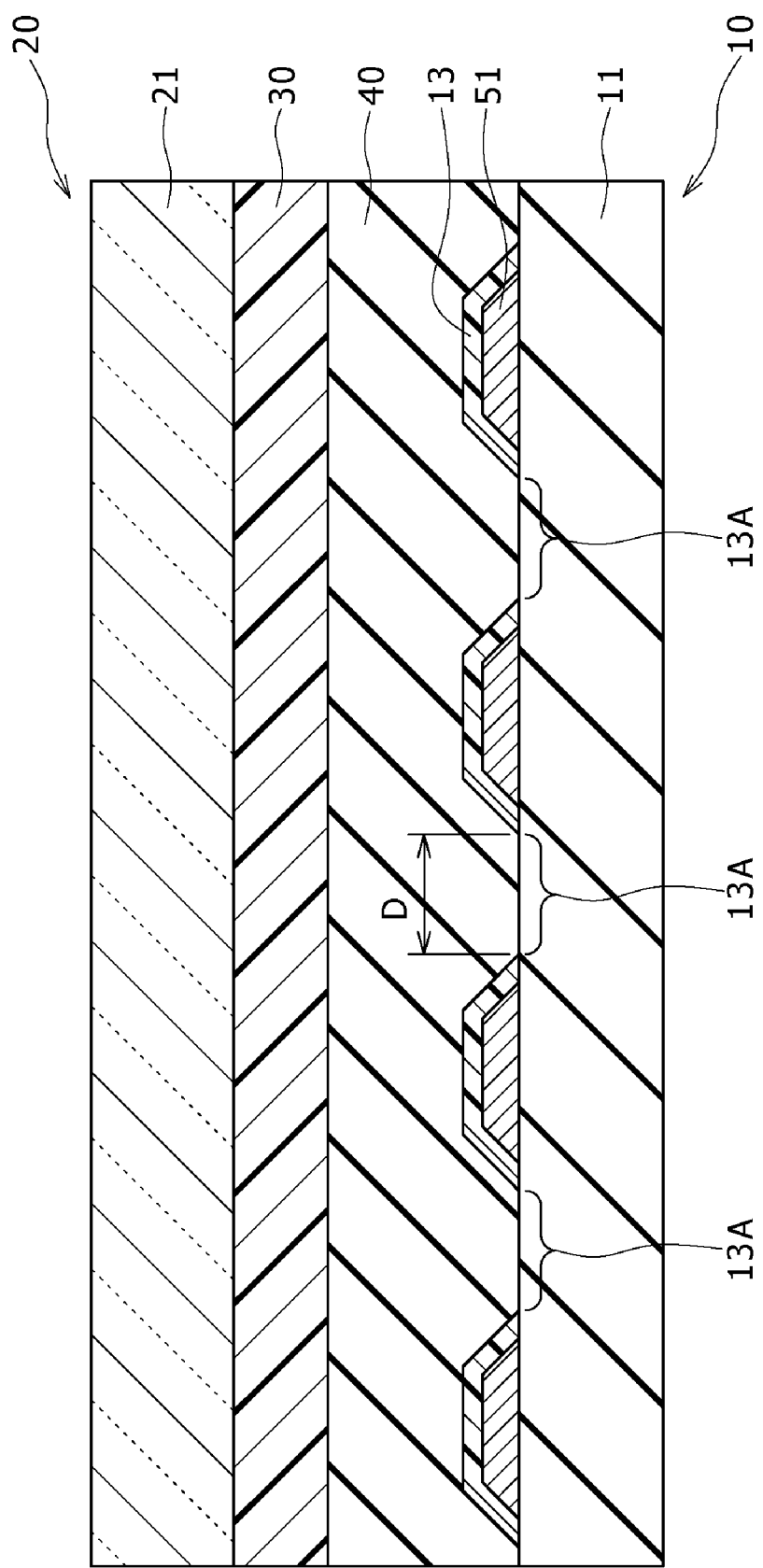
FIG. 4 is a sectional view taken along line IV-IV of FIG. 3.

FIG. 3 shows a plan-view structure of a part in the vicinity of a boundary part 10C between the adhesion region 10A and the terminal region 10B, and FIG. 4 shows a sectional structure at line IV-IV of FIG. 3. The coating layer 13 has inter-wire separation regions 13A each formed between the adjacent metallic wires 51. This ensures that corrosion of the metallic wires 51 in the display apparatus can be restrained, and reliability of the display apparatus can be enhanced drastically. Incidentally, in FIG. 3, the region where the coating layer 13 is formed is shaded.

The coating layer 13 is preferably covering upper surfaces and side surfaces of the plurality of metallic wires 51. This makes it possible to prevent the metallic wires 51 from short-circuiting or being damaged due, for example, to deposition of a foreign matter on the metallic wire 51 in the manufacturing process.

In addition, the inorganic insulating film 40 is preferably in contact with the driving substrate 11 in areas between the plurality of metallic wires 51. The reason lies in that, since the driving substrate 11 includes an inorganic material such as a glass as above-mentioned, adhesion between the inorganic insulating film 40 and the driving substrate 11 can be enhanced, and water (moisture) or impurity ions can be prevented from penetrating into the areas between the metallic wires 51 through the boundary part 10C between the adhesion region 10A and the terminal region 10B.

The width D, or the size in the array direction of the metallic wires 51, of the inter-wire separation region 13A is preferably set to be as large as possible, according to the distance between the adjacent wires 51. In addition, the length L, or the size in the direction along the metallic wires 51, of the inter-wire separation region 13A is desirably set to be as large as possible.

Besides, the inter-wire separation region 13A is so formed that an end edge on one side thereof, or the edge of the end thereof in the longitudinal direction which is located on the outer peripheral edge side of the terminal part 52, lies beyond the adhesion region 10A to reach the terminal region 10B but not to reach the end edge (outer peripheral edge) of the terminal region 10B. If the end edge of the inter-wire separation region 13A does not reach the end edge of the terminal region 10B, it is ensured that in the case of, for example, masking so as to prevent the adhesive layer 30 from protruding into the terminal region 10B, a flat region (full contact region) for the masking is secured in the range to the end edge of the terminal region 10B. The configuration in which the flat region (full contact region) can be secured in the range to the end edge of the terminal region 10B ensures, for example, that an improvement in the adhesive force of the masking tape can be expected, protrusion of the adhesive layer into the terminal region can be securely prevented through the enhanced assuredness of the masking, promising an enhanced reliability and an enhanced manufacturing yield of the display apparatus.

The seal panel 20 shown in FIGS. 1 and 2 has a sealing substrate 21, which is located on the side of the display part 14 of the driving panel 10 and is operative to seal organic light emitting devices 110R, 110G, and 110B together with the adhesive layer 30. The sealing substrate 21 includes a material such as a glass which is transparent to the light generated in the organic light emitting devices 110R, 110G, and 110B. The sealing substrate 21 is provided, for example, with a color filter or filters (not shown), and is operative to pick up the light generated in the organic light emitting devices 110R, 110G, and 110B, and to absorb external light reflected by the organic light emitting devices 110R, 110G, and 110B and the wires therebetween, thereby improving contrasts.

The adhesive layer 30 includes, for example, a thermosetting resin or a UV-curable resin.

Figure 5:
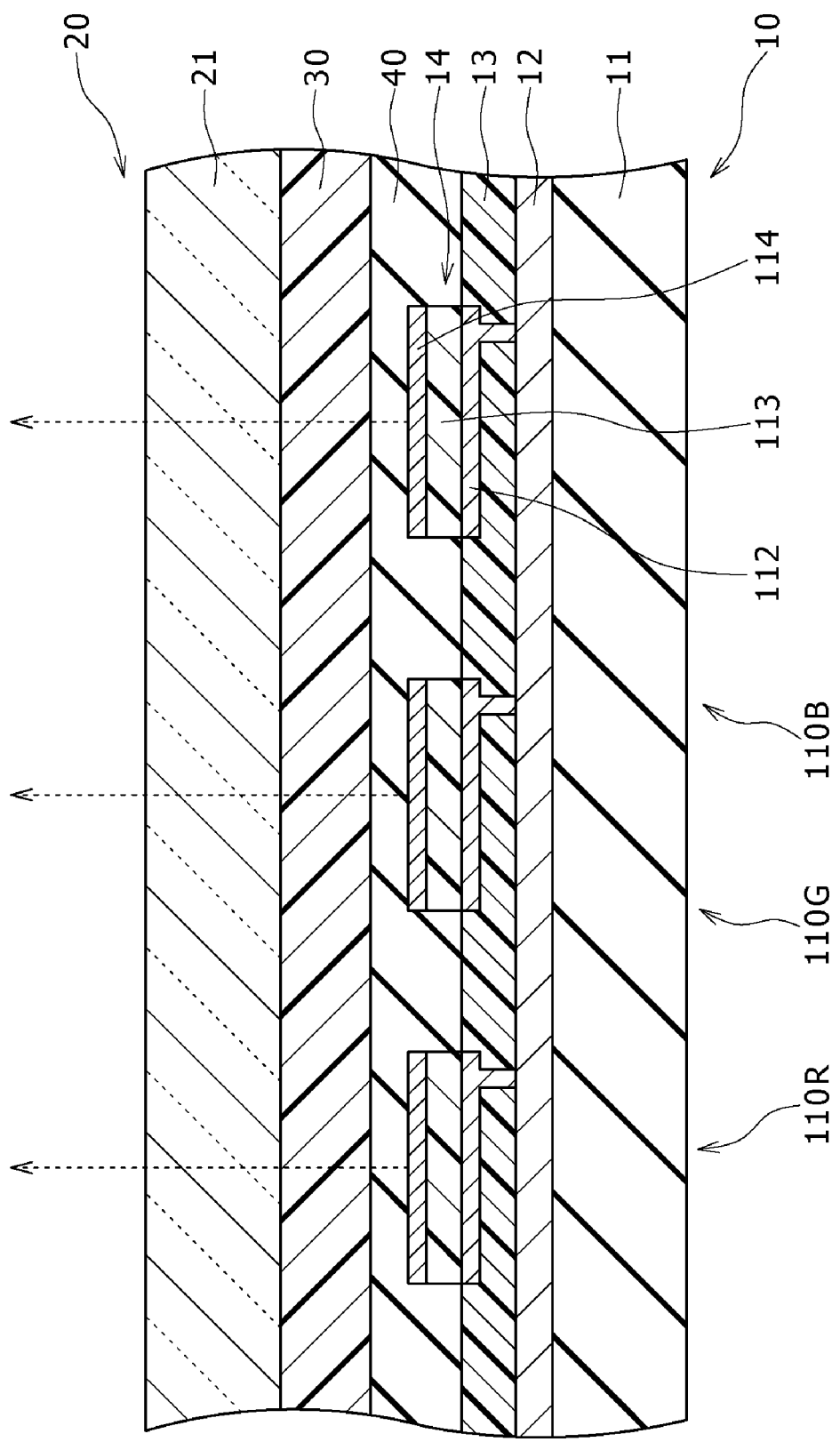
FIG. 5 is a sectional view showing an example of a display part shown in FIG. 2.

FIG. 5 illustrates an example of the configuration of the display part 14. The display part 14 has the organic light emitting devices 110R for generating red light, the organic light emitting devices 110G for generating green light, and the organic light emitting devices 110B for generating blue light, which are sequentially provided in a matrix pattern as a whole.

Each of the organic light emitting devices 110R, 110G, and 110B has, for example, a first electrode 112 as an anode, an organic layer 113 including a light emitting layer, and a second electrode 114 as a cathode, stacked in this order from the side of the driving substrate 11.

The first electrode 112 functions also as a reflective layer, and includes a metal or alloy, such as platinum (Pt), gold (Au), chromium (Cr), silver (Ag), and tungsten (W). Incidentally, the first electrode 112 is connected to a driving circuit in the circuit part 12 through a contact hole (not shown) provided in the coating layer 13.

The organic layer 113 has a configuration which differs depending on the color of the light generated by the organic light emitting device. The organic light emitting devices 110R and 110B each have a structure in which a hole transport layer, a light emitting layer and an electron transport layer are stacked in this order from the side of the first electrode 112, whereas the organic light emitting device 110G has a structure in which a hole transport layer and a light emitting layer are stacked in this order from the side of the first electrode 112. The hole transport layer is a layer for enhancing the efficiency of injecting holes into the light emitting layer. The light emitting layer is a layer for generating light when a current is injected therein. The electron transport layer is a layer for enhancing the efficiency of injecting electrons into the light emitting layer.

Examples of the material constituting the hole transport layer in the organic light emitting device 110R include bis [(N-naphthyl)-N-phenyl]benzidine (a-NPD). Examples of the material constituting the light emitting layer in the organic light emitting device 110R include 2,5-bis[4-[N-(4-methoxyphenyl)-N-phenylamino]]styrylbenzene-1,4-dicarbonitrile (BSB), and examples of the material constituting the electron transport layer in the organic light emitting device 110R include 8-quinolinol aluminum complex ($Alq_3$).

Examples of the material constituting the hole transport layer in the organic light emitting device 110G include α-NPD, and examples of the material constituting the light emitting layer in the organic light emitting device 110G include a mixture of Alq3 with 1 vol. % of Coumarin 6 (C6).

The second electrode 114 includes a semi-transparent electrode, and the light generated in the light emitting layer is taken out on the side of the second electrode 114. The second electrode 114 includes a metal or alloy, such as silver (Ag), aluminum (Al), magnesium (Mg), calcium (Ca), and sodium (Na).

The display apparatus as above can be manufactured, for example, as follows.

Figure 6E:
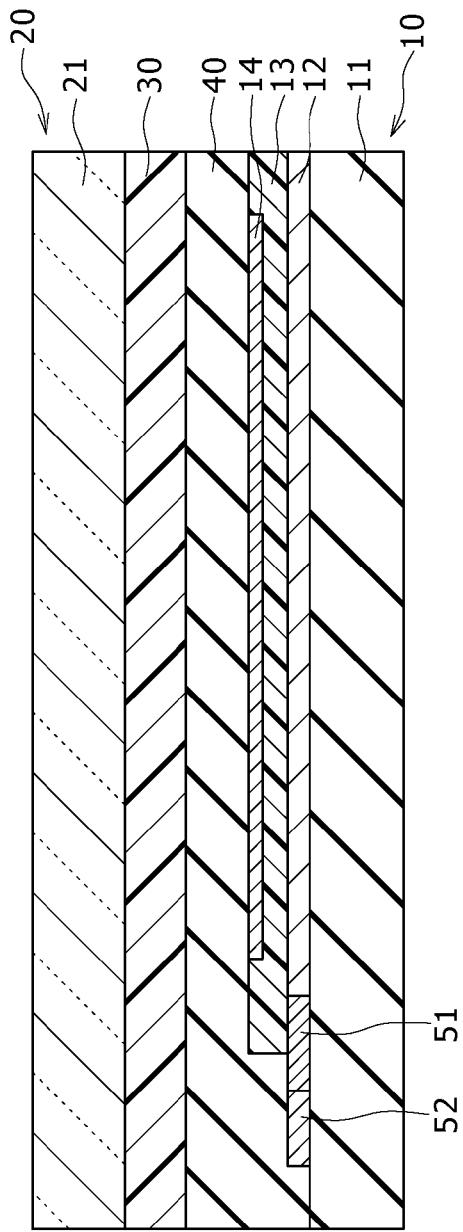

FIGS. 6A to 6F illustrate the method of manufacturing the display apparatus in the order of manufacturing steps. First, as shown in FIG. 6A, a circuit part 12 including a driving circuit and a peripheral circuit is formed on a driving substrate 11 formed from the above-mentioned material, a plurality of metallic wires 51 formed from the above-mentioned material in the above-mentioned thickness are extended from the circuit part 12 into a planned forming region 10B1 of a terminal region 10B, and terminal parts 52 are provided at the tips of the metallic wires 51.

Next, as shown in FIG. 6B, for example, the above-mentioned material is applied by, for example, a spin coating method, followed by exposure and development, to form a coating layer 13 in the above-mentioned thickness. Here, at the time of exposure, the coating layer 13 in a planned forming region 10A1 of an adhesion region 10A is partly removed, whereby inter-wire separation regions 13A are provided each between the adjacent metallic wires 51 (not shown in FIG. 6B; see FIGS. 3 and 4).

Subsequently, as shown in FIG. 6C, a display part 14 is formed on the coating layer 13. In forming the display part 14, first, a film of first electrodes 112 composed of the above-mentioned material is formed by, for example, DC sputtering, and the film is patterned into a predetermined shape by selectively etching the film by, for example, lithographic technology. Then, an organic layer 113 and second electrodes 114 composed of the above-mentioned materials are sequentially formed by, for example, a vapor deposition method, to form organic light emitting devices 110R, 110G, and 110B as shown in FIG. 5. In this manner, a driving panel 10 is formed.

Thereafter, as shown in FIG. 6D, an inorganic insulating film 40 composed of the above-mentioned material is formed on the display part 14.

After the driving panel 10 is formed, an adhesive layer 30 is formed on the inorganic insulating film 40, as shown in FIG. 6E. Thereafter, a sealing substrate 21 provided with color filters and composed of the above-mentioned material is prepared as a seal panel 20, and the driving panel 10 and the seal panel 20 are adhered to each other through an adhesive layer 30 therebetween, as shown in FIG. 6E.

Figure 6F:
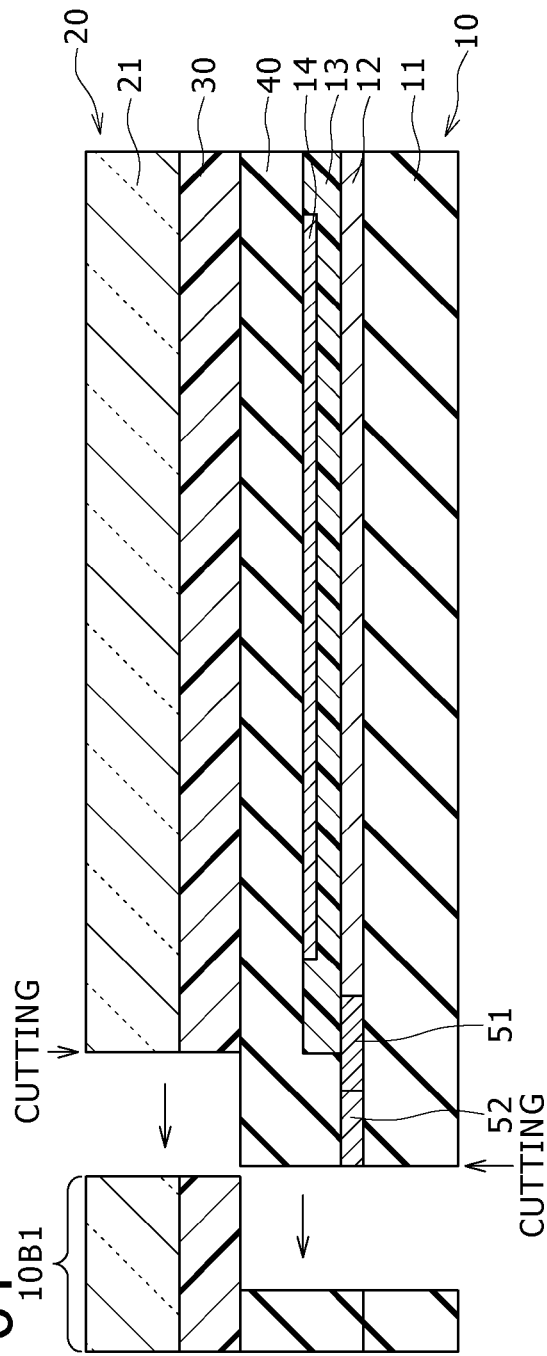

After the driving panel 10 and the seal panel 20 are adhered to each other, as shown in FIG. 6F, those parts of the seal panel 20 and the adhesive layer 30 which are located in a planned forming region 10B1 of a terminal region 10B are cut away, and then the inorganic insulating film 40 is removed by, for example, etching, to expose the metallic wires 51 and the terminal parts 52. By this, the terminal region 10B and the adhesion region 10A are formed. As a result, the display apparatus shown in FIGS. 1 to 5 is completed.

In the display apparatus, when a predetermined voltage is impressed between the first electrode 112 and the second electrode 114, a current is injected into the light emitting layer in the organic layer 113, and recombination of holes and electrons occurs, causing emission of light. The light is taken out through the second electrode 114, the inorganic insulating film 40 and the seal panel 20. Here, the coating layer 13 in the adhesion region 10A has the inter-wire separation regions 13A between the metallic wires 51, so that water (moisture) and impurity ions are prevented from penetrating into areas between the adjacent metallic wires 51 through the coating layer, whereby reliability of the display apparatus is enhanced.

Thus, in the present embodiment, since the coating layer 13 in the adhesion region 10A is provided with the inter-wire separation regions 13A between the adjacent metallic wires 51, water (moisture) and impurity ions can be prevented from penetrating into the areas between the adjacent metallic wires 51 through the coating layer 13. Therefore, it is possible to restrain corrosion of the metallic wires 51, thereby to prevent gravy troubles such as failure in turning ON of pixels, spoiling of basic performances, etc. arising from short-circuit between the metallic wires 51, and to remarkably enhance the reliability of the display apparatus.

In addition, the inter-wire separation regions 13A can be formed through a simple process in which the plan-view pattern in exposure of the coating layer 13 is only changed. Therefore, the display apparatus high in reliability can be realized, while preventing the structure and manufacturing process from being complicated due to provision of an additional layer, and without increases in material cost and the like.

Especially, since the inorganic insulating film 40 is in contact with the driving substrate 11 between the plurality of metallic wires 51, it is possible to enhance the adhesion between the inorganic insulating film 40 and the driving substrate 11 composed of an inorganic material such as a glass, and to prevent water (moisture) or impurity ions from penetrating into the areas between the metallic wires 51 through a boundary part 10C between the adhesion region 10A and the terminal region 10B.

Now, modification examples 1 to 3 of the first embodiment will be described below. The modification examples 1 to 3 have the same configuration as the first embodiment, except that the shapes or layout of the coating layer 13 and the inter-wire separation regions 13A is changed. The display apparatuses in modification examples 1 to 3 can be manufactured in the same manner as in the first embodiment, and the operations and effects thereof are the same as those in the first embodiment. Therefore, component elements corresponding to those in the first embodiment above are denoted by the same reference symbols as used above.

Modification Example 1

Figure 7:
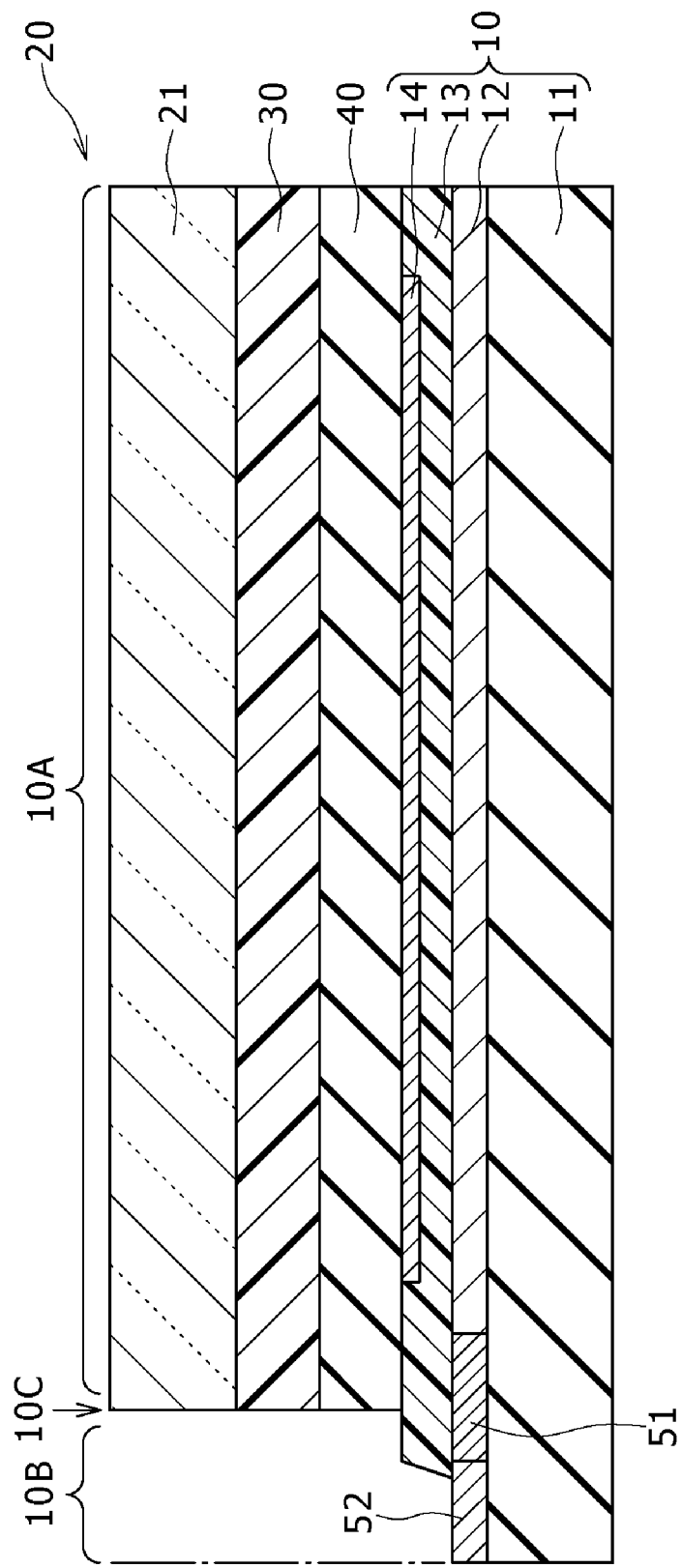
FIG. 7 is a sectional view showing the configuration of a display apparatus according to modification example 1 of the invention.
Figure 8:
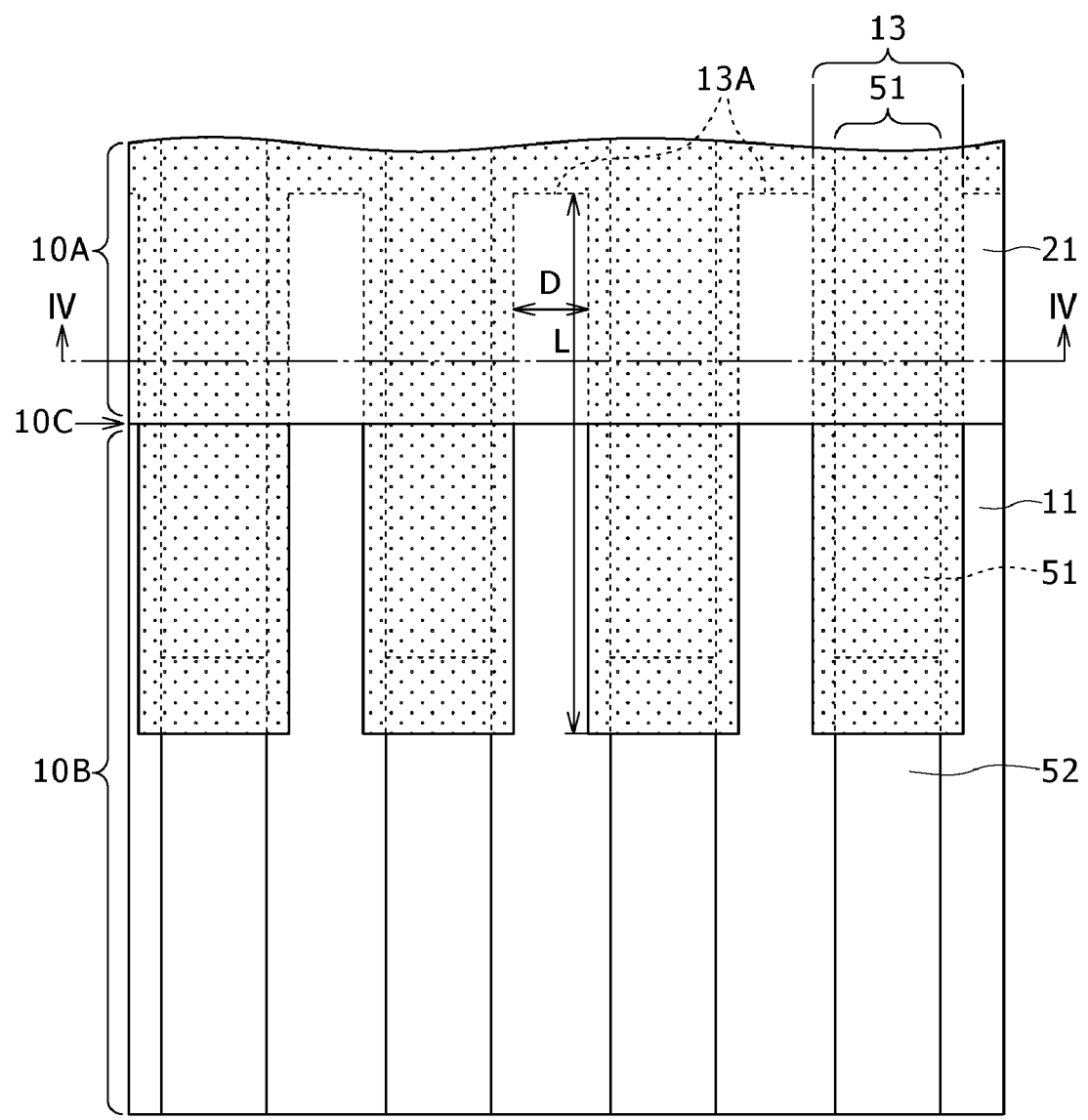
FIG. 8 is a plan view showing in an enlarged form a part in the vicinity of a boundary part of the display apparatus shown in FIG. 7.

FIG. 7 shows a sectional structure of a display apparatus according to modification example 1 of the present invention, and FIG. 8 shows a plan-view structure of a part in the vicinity of a boundary part 10C. In this display apparatus, a coating layer 13 is provided in an adhesion region 10A and a part of a terminal region 10B. Inter-layer separation regions 13A are provided to extend beyond the adhesion area 10A into the terminal region 10B. This ensures that, in this modification example, it is possible to absorb dispersions generated in cutting a seal panel 20 and an adhesive layer 30 in a planned forming region 10B1 of the terminal region 10B in a step shown in FIG. 6F after adhering a driving panel 10 and a seal panel 20 to each other in the manufacturing process.

Modification Example 2

Figure 9:
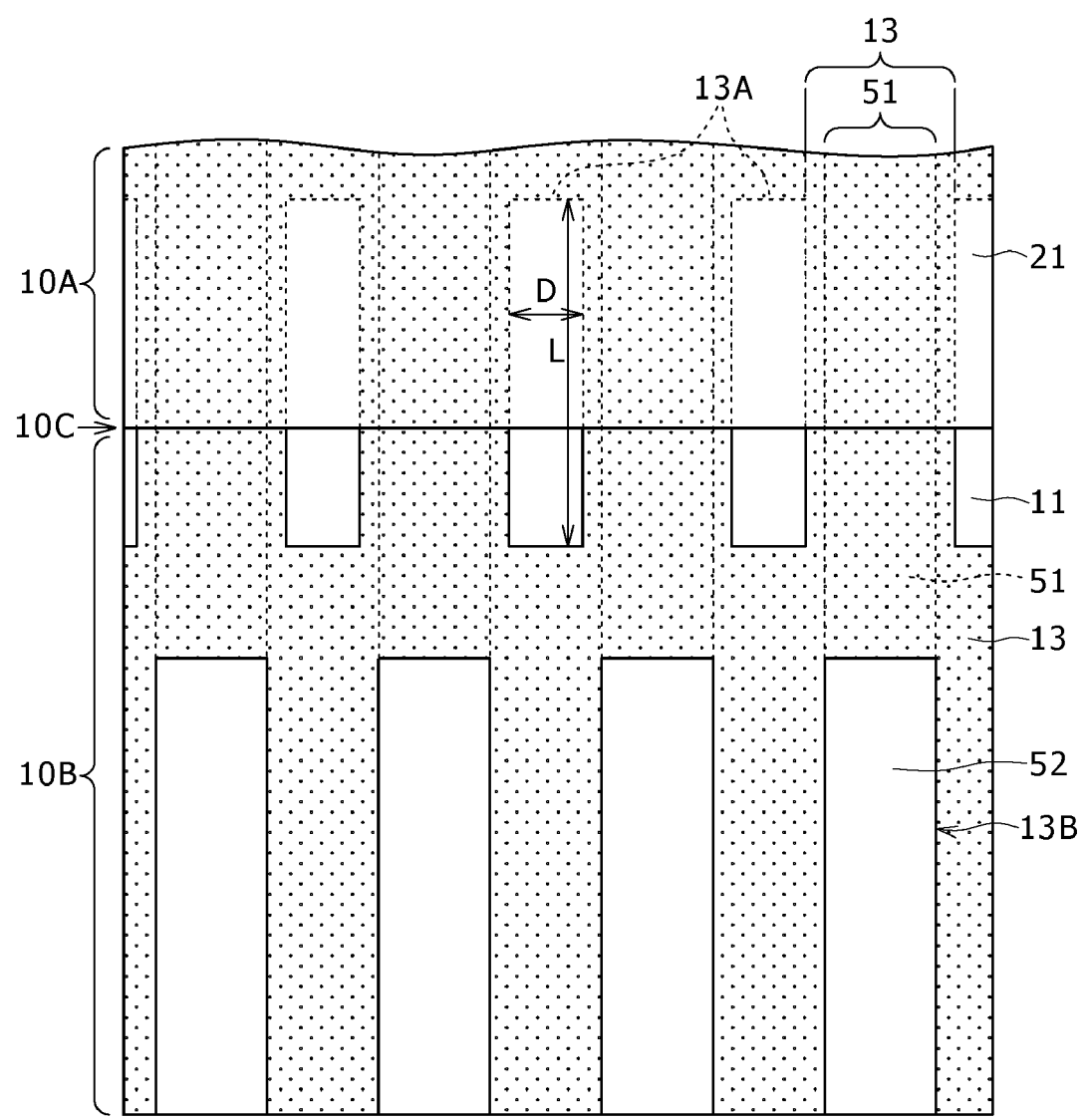
FIG. 9 is a plan view showing in an enlarged form a part in the vicinity of a boundary part of a display apparatus according to modification example 2 of the invention.

FIG. 9 shows a plan-view structure of a part in the vicinity of a boundary part 10C in a display apparatus according to modification example 2 of the present invention. The display apparatus has a configuration in which a coating layer 13 is provided throughout an adhesion region 10A and a terminal region 10B. The coating layer 13 is provided with openings 13B corresponding to terminal parts 52. With this modification example, also, the same effects as those of modification example 1 above can be obtained.

Modification Example 3

Figure 10:
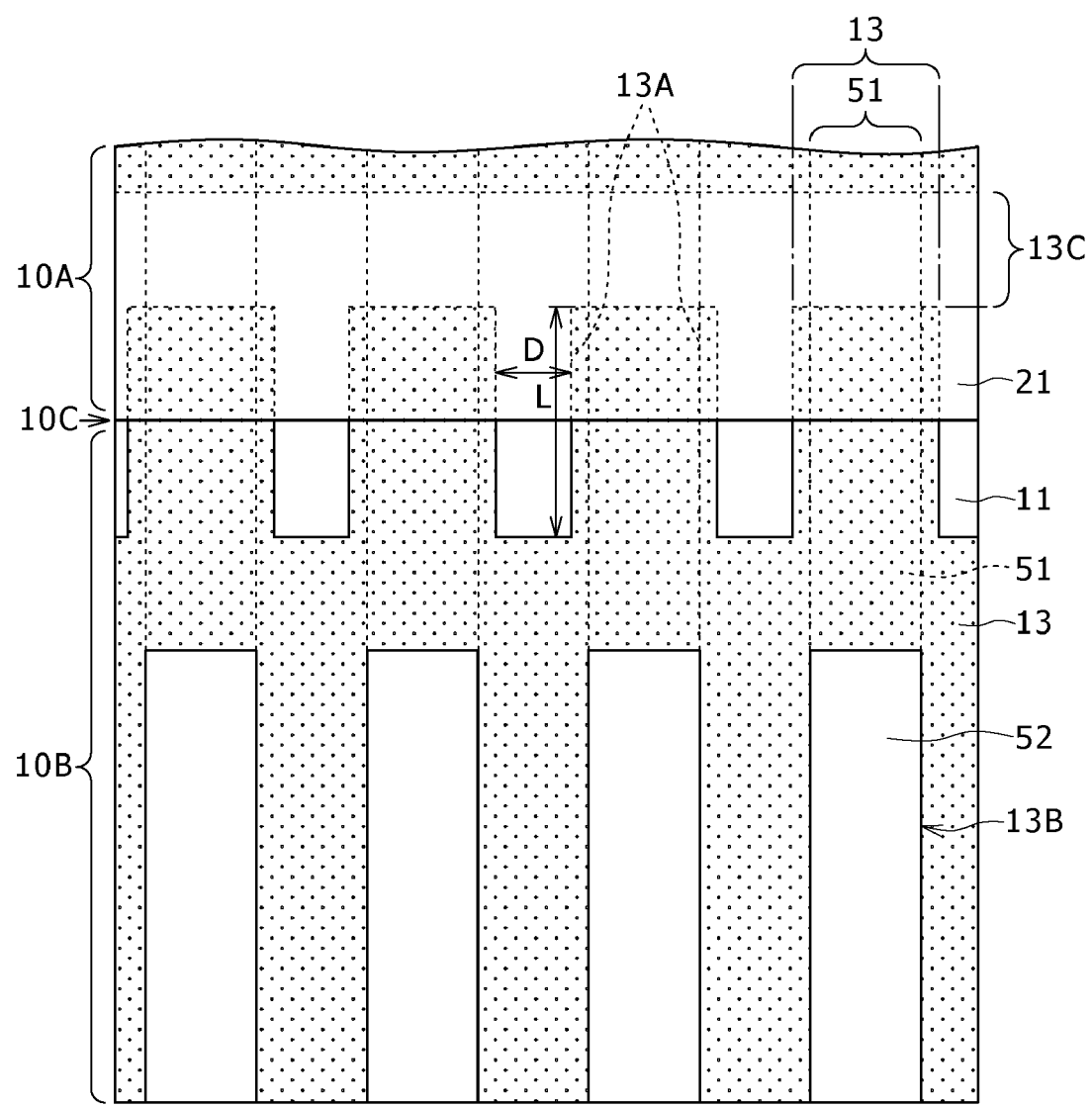
FIG. 10 is a plan view showing in an enlarged form a part in the vicinity of a boundary part of a display apparatus according to modification example 3 of the invention.

FIG. 10 shows a plan-view structure of a part in the vicinity of a boundary part 10C in a display apparatus according to modification example 3 of the present invention. In this display apparatus, a coating layer 13 is partly cut away, to form a crosswise separation region 13C extending in the array direction of metallic wires 51, and, by the crosswise separation region 13C, a portion where a display part 14 is formed on the coating layer 13 and a portion where the metallic wires 51 are covered in the vicinity of the boundary part 10C are separated from each other. This ensures that, in this modification example, it is possible to securely restrain water (moisture) or impurity ions from penetrating into areas between the metallic wires 51 in the vicinity of the boundary part 10C through the coating layer 13.

Figure 11:
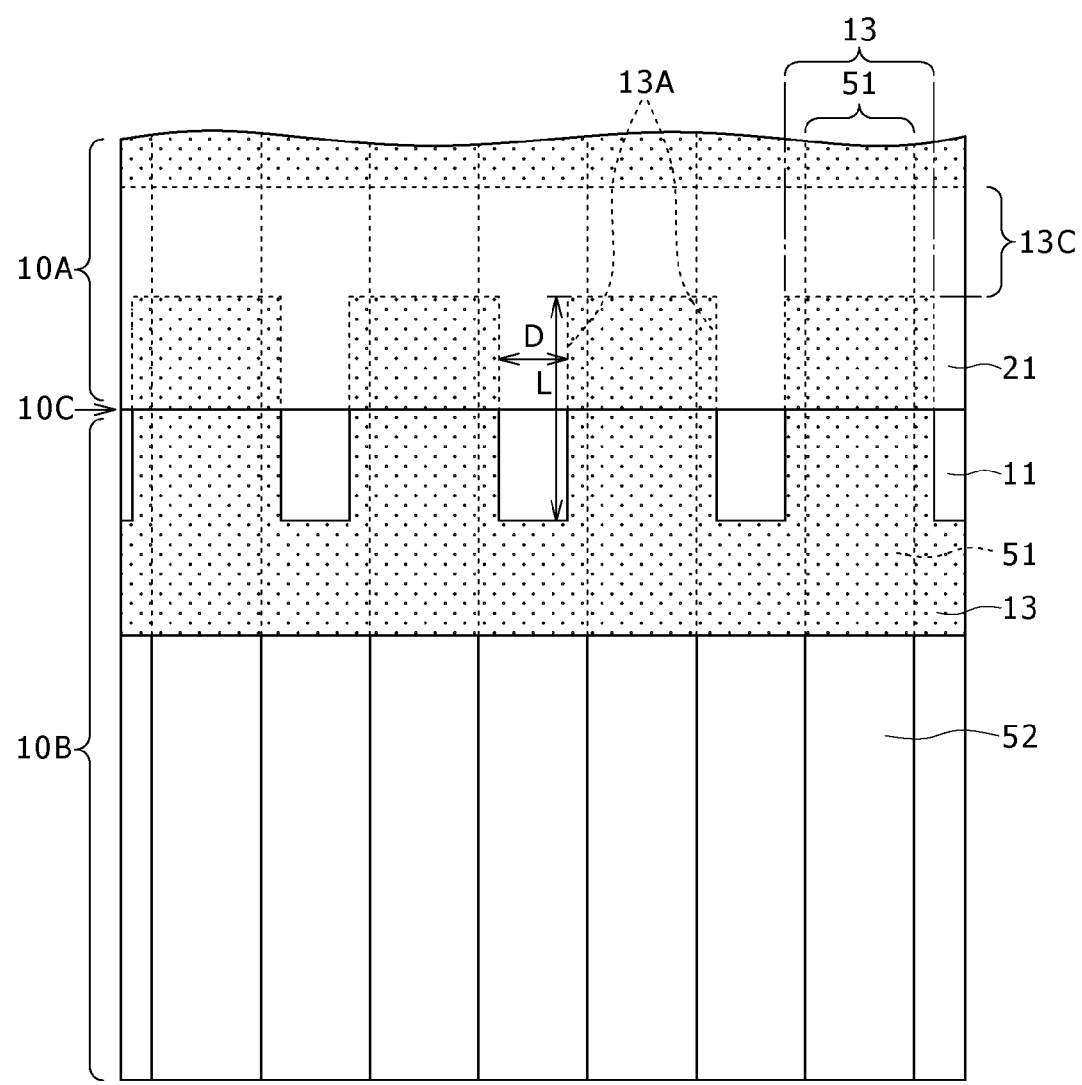
FIG. 11 is a plan view showing another modification example of the display apparatus shown in FIG. 2.

Incidentally, the coating layer 13 may be provided with openings 13B corresponding to terminal parts 52 as shown in FIG. 10, or the coating layer 13 may cover only the metallic wires 51 without reaching the terminal parts 52 as shown in FIG. 11.

Modification Example 4

Figure 12:
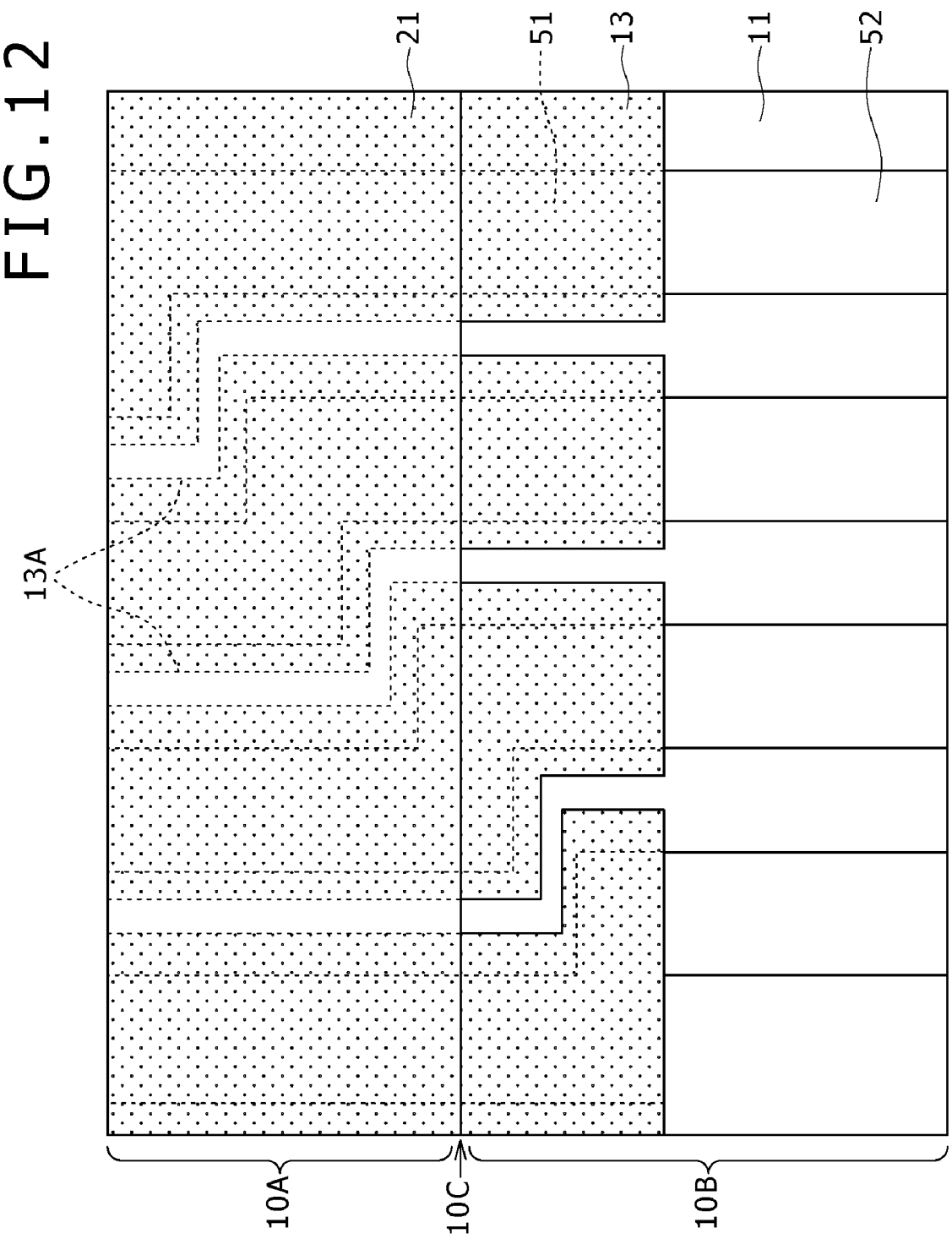
FIG. 12 is a plan view showing in an enlarged form a part in the vicinity of a boundary part of a display apparatus according to modification example 4 of the invention.

FIG. 12 shows a plan-view structure of a part in the vicinity of a boundary part 10C in a display apparatus according to modification example 4 of the present invention. In this display apparatus, metallic wires 51 are bent in the vicinity of a boundary part 51, and a coating layer 13 also is provided with bent-shaped inter-wire separation regions 13A according to the metallic wires 51. With this modification example, also, the same effects as those of modification example 1 can be obtained.

Second Embodiment

Figure 13:
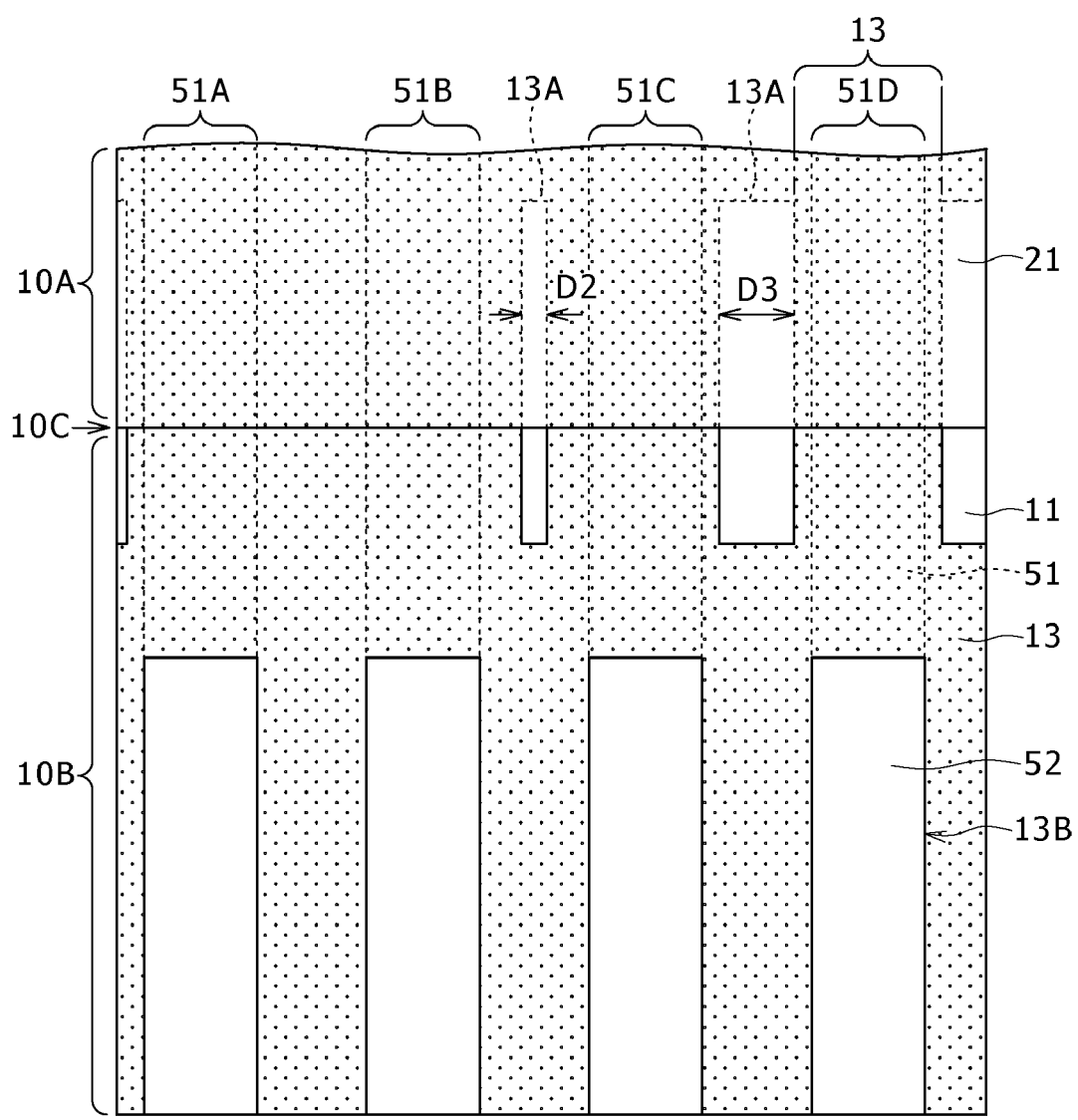
FIG. 13 is a plan view showing in an enlarged form a part in the vicinity of a boundary part of a display apparatus according to a second embodiment of the invention.

FIG. 13 shows a plan-view structure of a part in the vicinity of a boundary part 10C in a display apparatus according to a second embodiment of the present invention. The display apparatus has the same configuration as in modification example 2, except that the width D of an inter-wire separation region 13A is varied according to the potential difference between metallic wires 51 adjacent to each other through the inter-wire separation region 13A therebetween. Besides, the manufacturing method, operations and effects of the display apparatus in this embodiment are the same as in modification example 2. Therefore, component elements corresponding to those in modification example 2 above are denoted by the same reference symbols as used above.

For example, in the case where four metallic wires 51A, 51B, 51C, and 51D are provided, when the potential difference V1 between the metallic wires 51A and 51B is extremely small, a configuration may be adopted in which the distance D1 therebetween is zero, namely, no inter-wire separation region 13A is provided. This configuration makes it possible to improve the flatness of a coating layer 13 between the metallic wires 51 of which the possibility of corrosion is low. In addition, when the potential difference V2 between the metallic wires 51B and 51C is not considerably large, the distance D2 therebetween may be small. When the potential difference V3 between the metallic wires 51C and 51D is very large, the distance D3 therebetween is desirably set to be large.

Thus, in this embodiment, the width D of the inter-wire separation region 13A is varied according to the potential difference between the metallic wires adjacent to each other through the inter-wire separation region 13A therebetween. Therefore, it is possible to maintain the flatness of the coating layer 13 between the metallic wires 51 of which the possibility of corrosion is low. On the other hand, in regard of the metallic wires 51 of which the possibility of corrosion is high, penetration of water (moisture) or impurity ions can be securely restrained. This results in further enhancement of reliability of the display apparatus.

Third Embodiment

Figure 14:
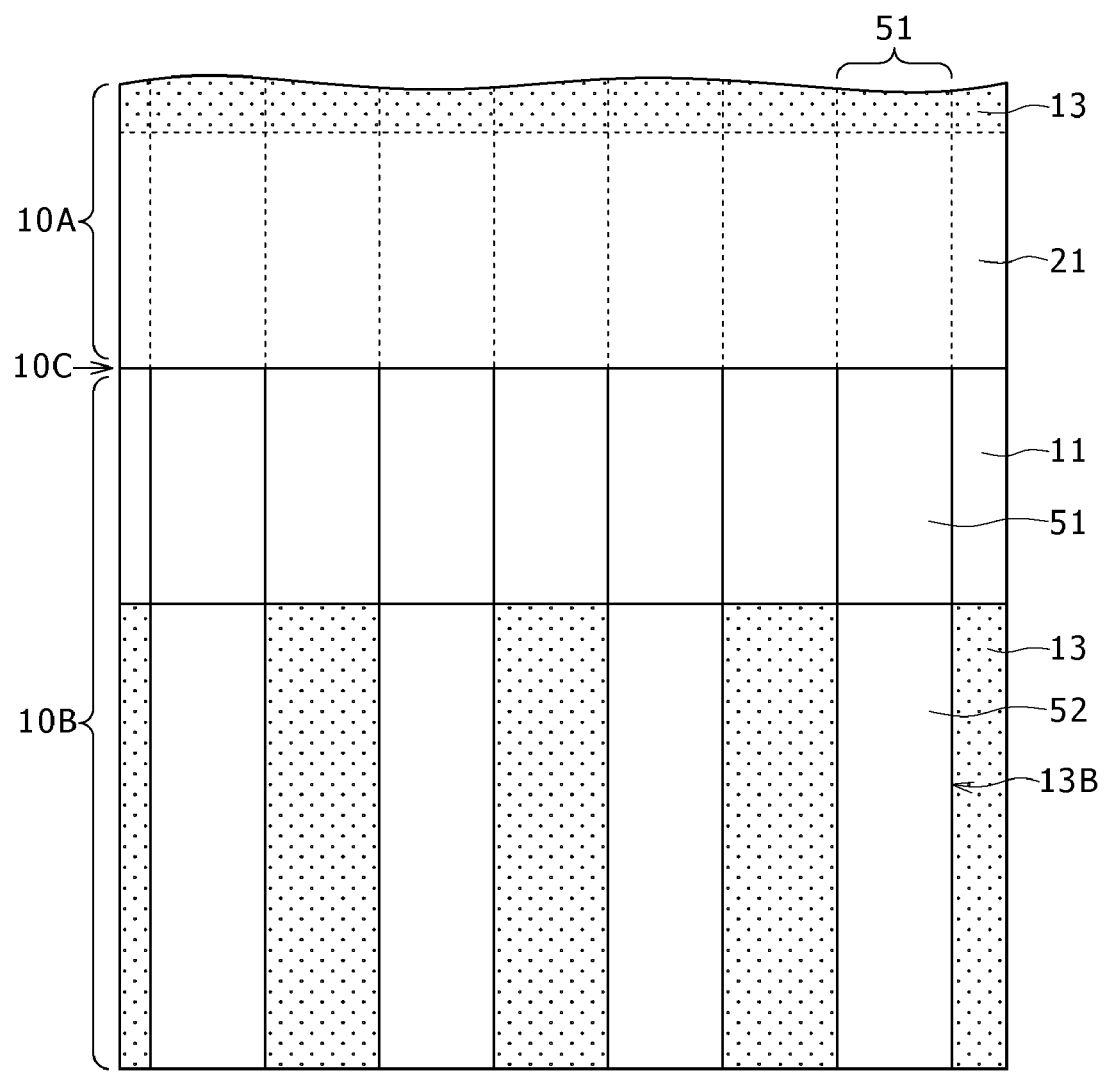
FIG. 14 is a plan view showing in an enlarged form a part in the vicinity of a boundary part of a display apparatus according to a third embodiment of the invention.

FIG. 14 shows a plan-view structure of a part in the vicinity of a boundary part 10C in a display apparatus according to a third embodiment of the present invention. This display apparatus has the same configuration as that in modification example 3 above, except that a plurality of metallic wires 51 are covered with a coating layer 13 on the terminal region 10B side relative to the boundary region 10C. The display apparatus can be manufactured in by the same manufacturing method as above.

In this display apparatus, light emission is effected in the same manner as in the first embodiment, and the light is taken out on the side of a seal panel 20. Here, since the plurality of metallic wires 51 are covered with the coating layer 13 on the terminal region 10B side relative to the boundary part 10C, water (moisture) and impurity ions can be prevented from penetrating into an adhesion region 10A from the boundary part 10C side through the coating layer 13.

Thus, in this embodiment, the plurality of metallic wires 51 are covered with the coating layer 13 on the terminal region 10B side relative to the boundary part 10C between the terminal region 10B and the adhesion region 10A, so that penetration of water (moisture) or impurity ions into the adhesion region 10A from the boundary part 10C side through the coating layer 13 can be prevented. Therefore, it is possible to restrain corrosion of the metallic wires 51, thereby to prevent gravy troubles such as failure in turning ON of pixels and spoiling of basic performances because of short-circuit between the metallic wires 51, and to drastically enhance the reliability of the display apparatus.

Furthermore, a specific example of the present invention will be described below.

Example

A display apparatus was manufactured in the same manner as in the first embodiment above. In this instance, the metallic wires 51 were formed from aluminum (Al), and the coating layer 13 was composed of a polyimide. The plan-view shape of the coating layer 13 was set to be the same as in FIG. 10 showing modification example 3, inter-wire separation regions 13A were each provided between the adjacent metallic wires 51, and the inorganic insulating film 40 composed of silicon nitride ($SiN_X$) and the driving substrate 11 composed of a glass were set in contact with each other. The width D of each of the inter-wire separation region 13A was 10 μm. The display apparatus thus obtained was operated for 1000 hours in a hot and humid condition of 40° C. and 95%, and then the metallic wires 51 were observed under an optical microscope. The results are shown in FIG. 15.

As a comparative example for the present example, a display apparatus was manufactured in the same manner as in the present example, except that the metallic wires were covered with a continuous coating layer in the adhesion region. The display apparatus in this comparative example was also operated for 1000 hours in a hot and humid condition of 40° C. and 95%, and then the metallic wires were observed under an optical microscope. The results are shown in FIG. 16.

As seen from FIG. 15, according to the present example, corrosion of the metallic wire 51 was very slight. On the other hand, in the comparative example, marked progress of corrosion of the metallic wires was recognized. Specifically, it was found that when the coating layer 13 in the adhesion region 10A is provided with the inter-wire separation regions 13A between the metallic wires 51, corrosion of the metallic wires 51 can be restrained.

Fourth Embodiment

Figure 17A:
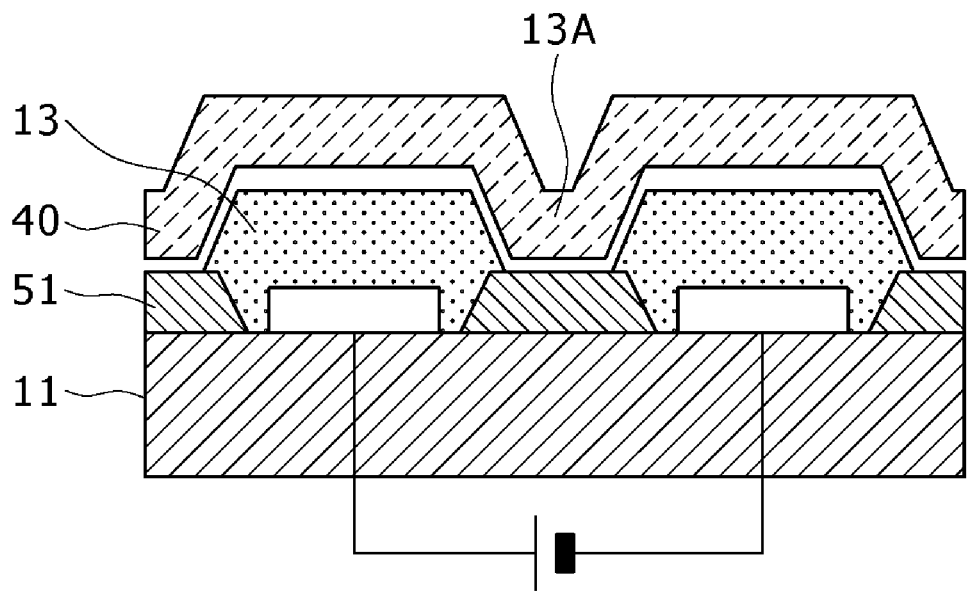
FIGS. 17A and 17B are sectional views illustrating a sectional structure of an inter-wire separation region.
Figure 17B:
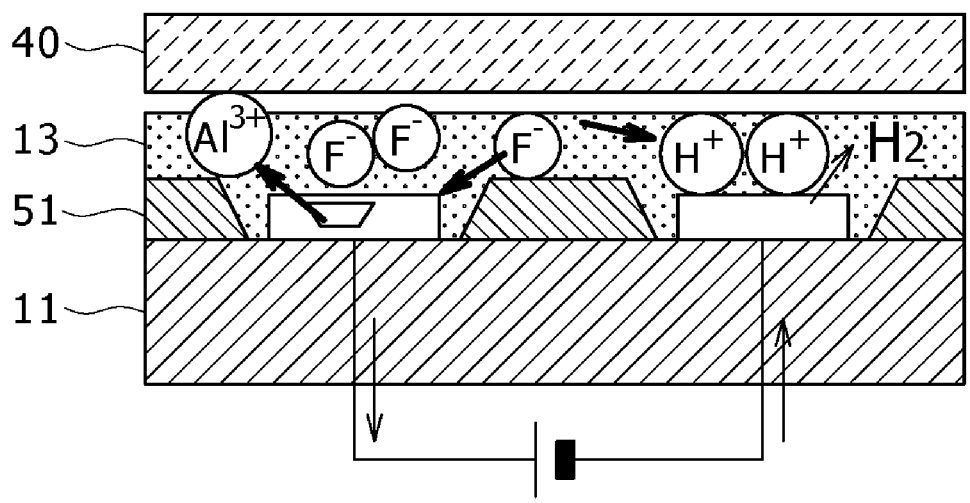

FIGS. 17A and 17B show a sectional structure of an inter-wire separation region.

As has been described in the first to third embodiments above, the plurality of metallic wires 51 in the display apparatus are covered with the coating layer 13. It is to be noted here that the coating layer 13 is formed from an organic photosensitive material and, hence, permits water (moisture) ($H_2O$) to easily pass therethrough.

Therefore, where the metallic wires 51 are simply covered with the coating layer 13, for example as shown in FIG. 17B, absorption of water (moisture) into the coating layer 13 causes an ion exchange reaction between the adjacent metallic wires 51, which may result in corrosion of the metallic wires 51.

Taking this into account, in the first to third embodiments above, as shown in FIG. 17A, the inter-wire separation regions 13A are each provided between the metallic wires 51 so as to interrupt the path necessary for the ion exchange reaction, thereby preventing the above-mentioned phenomenon.

On the other hand, in the display apparatus configured as above, the upper side of the driving panel 10 in the adhesion region 10A is sealed by the seal panel 20, through the adhesive layer 30 therebetween. In the case of manufacturing the display apparatus with such a configuration, it is a usual practice to cover the upper side of the terminal region 10B, more specifically, the upper side of the coating layer 13 in the terminal region 10B with a masking tape so as to prevent a thermosetting resin or UV-curable resin constituting the adhesive layer 30 from flowing out to the side of the terminal region 10B.

However, on the coating layer 13, the inter-wire separation regions 13A are provided to extend beyond the adhesion region 10A so as to reach the terminal region 10B. Therefore, in the areas where the inter-wire separation regions 13A are provided, a gap would be generated between the upper surface of the coating layer 13 and the masking tape adhered for the purpose of protection from the adhesive layer 30, which may result in that the thermosetting resin or UV-curable resin constituting the adhesive layer 13 penetrates through the gap.

Particularly, in recent years, there has been a tendency toward a narrower pitch of the metallic wires 51, whereas there is a limit to the minimum width allowed for the inter-wire separation region 13A. On a relative basis, therefore, the proportion occupied by the inter-wire separation regions 13A based on the upper surface of the coating layer 13 has been increasing, and, as a result, the penetration of the thermosetting resin or UV-curable region has come to occur conspicuously.

Taking the foregoing into consideration, in the display apparatus in the present embodiment, the inter-wire separation regions 13A are each so formed that the end edge thereof lies beyond the adhesion region 10A to reach the terminal region 10B but not to reach the end edge of the terminal region.

FIG. 18 is a plan view showing in an enlarged form a part in the vicinity of a boundary part 10C between the adhesion region 10A and the terminal region 10B in the display apparatus in the present embodiment.

As illustrated in the figure, on a driving panel 10, the region in the vicinity of one end edge thereof is divided into the adhesion region 10A and the terminal region 10B, with the boundary part 10C therebetween. In the terminal region 10B, the coating layer 13 is formed on the side of the boundary part 10C, but the coating layer 13 is not formed and terminal parts 52 are therefore exposed on the side of the end edge of the terminal region 10B. In other words, the end edge position of the coating layer 13 does not reach the end edge of the terminal region 10B but is located on the side of the adhesion region 10A relative to the end edge of the terminal region 10B.

In addition, the coating layer 13 covering the metallic wires 51 is provided with inter-wire separation regions 13A each formed between the adjacent metallic wires 51. It is to be noted here that the inter-wire separation regions 13A are each so formed that the end edge part thereof lies beyond the adhesion region 10A to reach the terminal region 10B but not to reach the end edge of the terminal region 10B, more specifically, not to reach the end edge position of the coating layer 13.

This results in that a region where the inter-wire separation regions 13A are not formed on the coating layer 13, i.e., a flat region 10D where the upper surface of the coating layer 13 constitutes a flat surface in the array direction of terminals, is secured between the end edges of the inter-wire separation regions 13A and the end edge of the coating layer 13.

In the display apparatus configured as above, in the vicinity of the boundary part 10C between the adhesion region 10A and the terminal region 10B, the end edge parts of the inter-wire separation regions 13A does not reach the end edge position of the coating layer 13. Therefore, in the case of adhering a masking tape onto the coating layer 13 so as to prevent the thermosetting resin or UV-curable resin constituting the adhesive layer 20 from flowing out to the side of the terminal region 10B, the flat region 10D secured between the end edges of the inter-wire separation regions 13A and the end edge position of the coating layer 13 promises full contact between the flat region 10D and the masking tape, whereby an adhesive force of the masking tape is secured. In other words, by securing the flat region 10D suitable for adhering the masking tape thereto, an improvement in the adhesive force of the masking tape can be expected.

Therefore, it is possible, through the assuredness of the masking, to securely prevent the thermosetting resin or UV-curable resin constituting the adhesive layer 30 from flowing out into the terminal region 10B or penetrating into a gap between the upper surface of the coating layer 13 and the masking tape. Consequently, improvements in the reliability and the manufacturing yield of the display apparatus are promised.

Incidentally, the positions of the end edges of the inter-wire separation regions 13A are not particularly limited insofar as they lie beyond the adhesion region 10A to reach the terminal region 10B but not to reach the end edge of the coating layer 13. However, the inter-wire separation regions 13A are desirably formed as follows.

In order that the inter-wire separation regions 13A function to interrupt the paths of ion exchange reactions and thereby to prevent corrosion of the metallic wires 51, it suffices to form the inter-wire separation regions 13A so that the positions of the end edges thereof coincide with the end edge of the adhesion region 10A, namely, the position of the boundary part 10C. It is to be noted here, however, that where the positions of the end edges of the inter-wire separation regions 13A are made to coincide with the position of the boundary part 10C, the end edge parts may fail to reach the boundary part 10C, due to dispersions in forming the inter-wire separation regions 13A. Therefore, taking the dispersions in forming the inter-wire separation regions 13A into consideration, the end edge parts of the inter-wire separation regions 13A are desirably so formed as to protrude beyond the boundary part 10C to the side of the terminal region 10B at least by a predetermined amount corresponding to the dispersions (by a predetermined margin amount).

In addition, in regard of the securing of the adhesive force of the masking tape, better results are obtained as the area of the flat region 10D is larger. In view of this, the positions of the end edges of the inter-wire separation regions 13A are desirably located as close as possible to the boundary region 10C, within such a range as not to reduce the predetermined margin amount.

Fifth Embodiment

In the display apparatus described in the fourth embodiment above, the end edges of the inter-wire separation regions 13A do not reach the end edge of the coating layer 13, and the flat region 10D is secured therebetween.

It is to be noted here, however, that in recent years there has been a trend toward a narrower pitch of the metallic wires 51, and, attendantly, the width of the inter-wire separation regions 13A has also been tending to be reduced.

Therefore, in the case where the coating layer 13 and the inter-wire separation regions 13A are so configured that the end edges of the inter-wire separation regions 13A do not reach the end edge of the coating layer 13, resist residue may result in the vicinity of the end edges of the inter-wire separation regions 13A.

FIGS. 19A to 19C illustrate the outline of generation of resist residue.

As shown in FIG. 19A, in the vicinity of the end edges of the inter-wire separation regions 13A, specifically, in the vicinity of the steps between the inter-wire separation regions 13A and the coating layer 13, if the steps are steep, formation of a resist film on the upper side of the vicinity areas results in the problem that the thickness of the resist film would not follow up to the steps and the follow-up property of the resist film thickness deteriorates. Then, a film thickness difference between the side of the coating layer 13 and the side of the inter-wire separation region 13A is generated in some of the vicinity areas.

Therefore, as shown in FIG. 19B, the resist film thickness is so large that an unreacted portion is generated upon the subsequent exposure due to insufficient exposure, in the vicinity of the steps, specifically, in the areas where the film thickness difference is present. As a result, resist residue is generated, as shown in FIG. 19C.

Taking this into account, in the display apparatus in the present embodiment, the plan-view shape of the end edge parts of the inter-wire separation regions 13A are configured as follows.

Figure 20A:
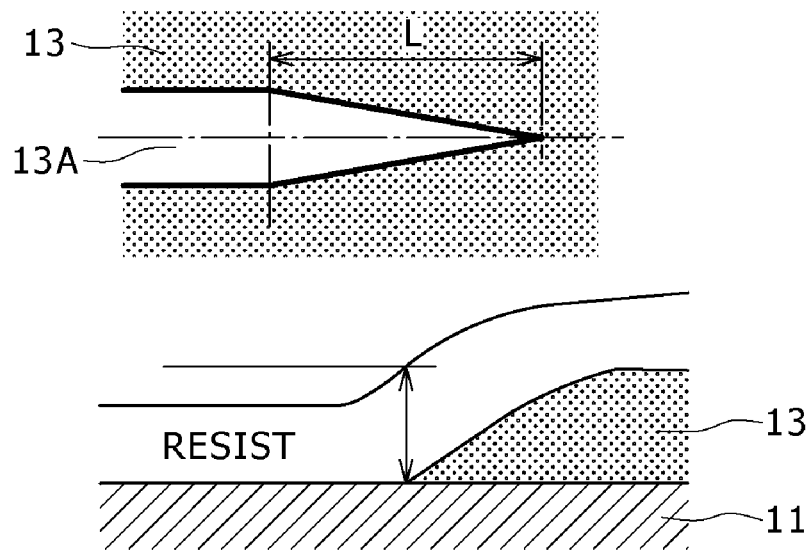
FIGS. 20A and 20B illustrate an example of the plan-view shape of an end edge part of the inter-wire separation region in a display apparatus according to a fifth embodiment of the invention.
Figure 20B:
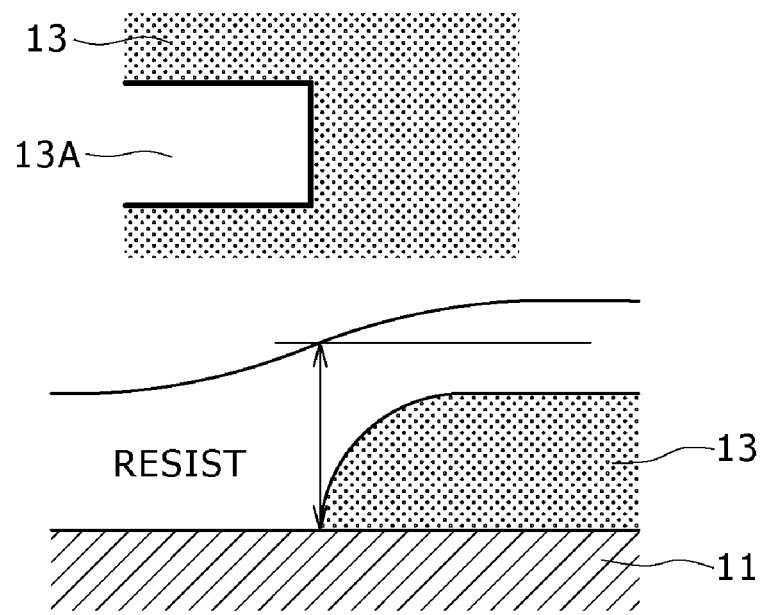

FIGS. 20A and 20B illustrate an example of the plan-view shape of the end edge parts of the inter-wire separation regions 13A.

In the case where the plan-view shape of the end edge part of the inter-wire separation region 13A is rectangular, i.e., is constituted of two right angles and a line segment connecting them to each other as shown in FIG. 20B, the step between the inter-wire separation region 13A and the coating layer 13 is steep, and resist residue is considered to be generated easily.

To obviate this problem, in the display apparatus in the present embodiment, as shown in FIG. 20A, the plan-view shape of the end edge part of the inter-wire separation region 13A is set to be a tapered shape such that the tip is sized to be not larger than the resolution limit in forming the inter-wire separation region 13A. In other words, the length of the tip portion which is not larger than the resolution limit (see L in the figure) is secured to be not less than a certain value. This ensures that the step between the inter-wire separation region 13A and the coating layer 13 is not steep but gently sloped. As a result, at the time of forming a resist film, the follow-up property of the resist film thickness is enhanced as compared with the case of the configuration shown in FIG. 20B, whereby generation of resist residue can be restrained.

Modification Example

It is considered that the resist residue is liable to be generated, also according to the influence of the plan-view shape of the end edge part of the inter-wire separation region 13A. For example, as shown in FIG. 20B, where all the vertex angles constituting the end edge part of the inter-wire separation region 13A are right angles, the resist residue is liable to be generated in the vertex angles. The possibility of generation of resist residue is high also where the vertex angles are acute angles smaller than right angle.

Taking this into consideration, the plan-view shape of the end edge part of the inter-wire separation region 13A may be set as follows.

Figure 21A:
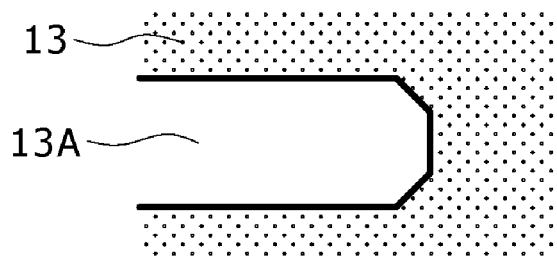
FIGS. 21A to 21C are plan views illustrating other examples of the end edge part of the inter-wire separation region in the display apparatus according to the fifth embodiment of the invention.
Figure 21B:
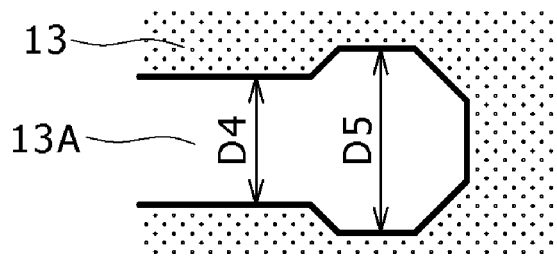
Figure 21C:
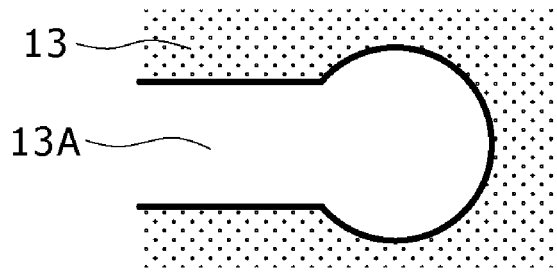
Figure 22:
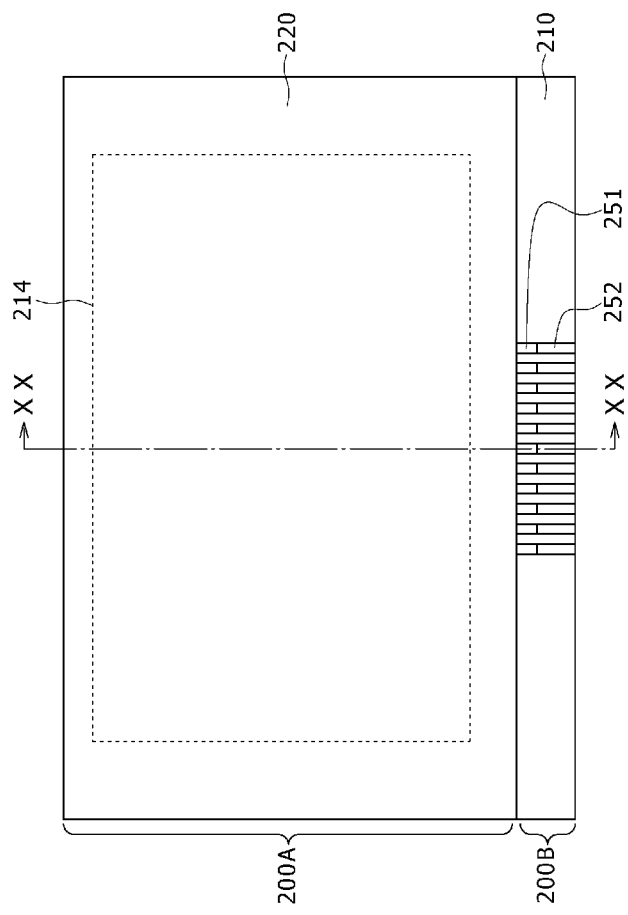
FIG. 22 is a plan view schematically showing the configuration of a display apparatus according to the related art.
Figure 23:
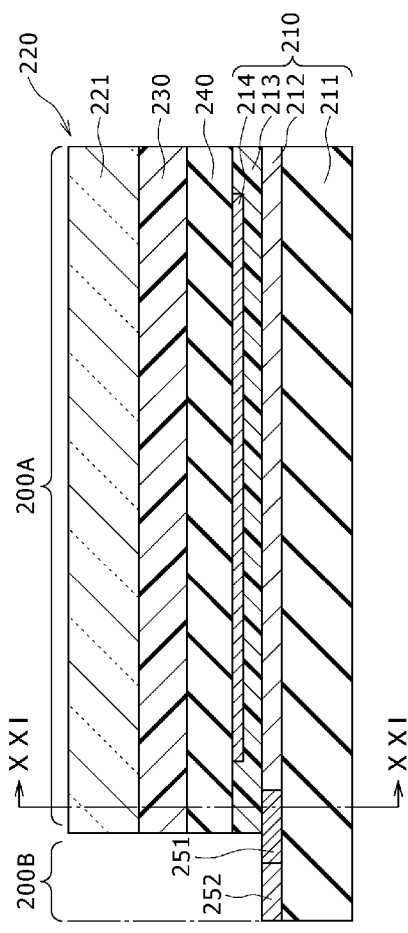
FIG. 23 is a sectional view taken along line XIX-XIX of FIG. 22.
Figure 24:
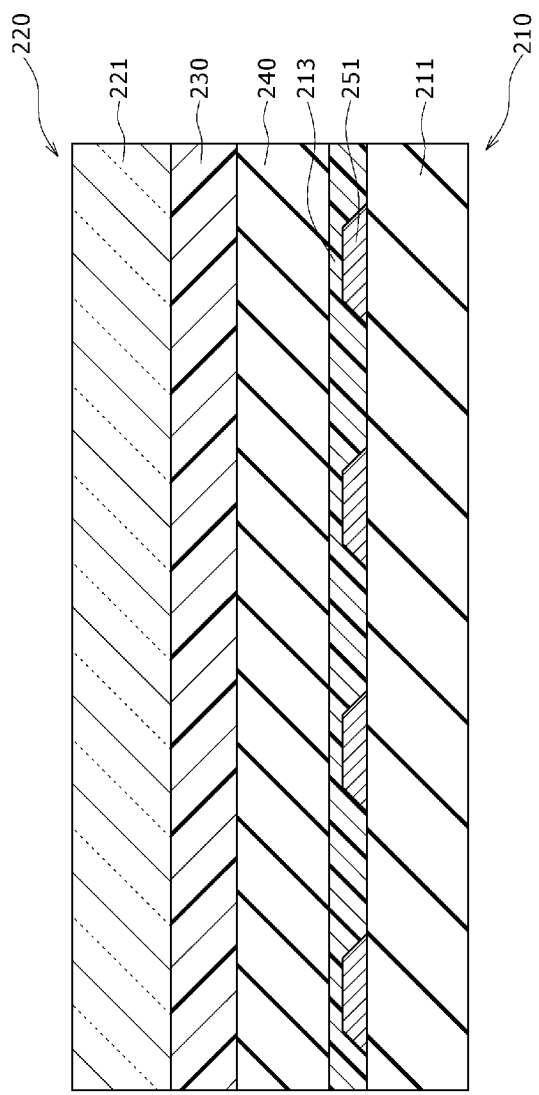
FIG. 24 is a sectional view taken along line XXI-XXI of FIG. 23.

FIGS. 21A to 21C illustrate other examples of the plan-view shape of the end edge part of the inter-wire separation region 13A.

In the plan-view shape of the end edge part of the inter-wire separation region 13A shown in FIG. 21A, all the vertex angles constituting the end edge part are obtuse angles larger than right angle. The number of the vertex angles is not particularly limited insofar as all the vertex angles are obtuse angles. According to the end edge part of the inter-wire separation region 13A configured in this manner, generation of resin residue can be suppressed, as compared with the case where the vertex angles are right angles or acute angles.

In addition, in the plan-view shape of the end edge part of the inter-wire separation region 13A shown in FIG. 21B, the end edge part is formed to be wider than the other part. Namely, the width D5 of the end edge part is greater than the width D4 of the other part. In this case, also, all the vertex angles constituting the end edge part are obtuse angles. It is to be noted here that the number of the vertex angles is not particularly limited. The end edge of the inter-wire separation region 13A configured in this manner is very effective in restraining the generation of resist residue at the end edge part of the inter-wire separation region 13A, even where the pitch of the metallic wires 51 tends to become smaller and, attendantly, the width D4 of the inter-wire separation region 13A tends to become smaller.

The expression "the vertex angles are obtuse angles" used here includes the meaning of the case where the vertex angles are not clear. Specifically, even where the end edge part of the inter-wire separation region 13A is formed in a circular shape as shown in FIG. 21C and where the presence of vertex angles cannot be said to be obvious, this case can be considered to be equivalent to the case where vertex angles as obtuse angles are present, as viewed microscopically. Therefore, this case is also included as one of the modes where the vertex angles are obtuse angles.

While the present invention has been described showing embodiments (and examples) as above, the invention is not limited to the above embodiments, and various modifications are possible. For example, while the case where the plurality of metallic wires 51 are all disposed at regular intervals has been described in the above embodiments, the plurality of metallic wires 51 may also be disposed at varying intervals. In that case, the width D of the inter-wire separation regions 13A may be varied according to the intervals of the metallic wires 51.

Besides, in the second embodiment above, the plurality of metallic wires 51 may be arranged at varying intervals, and the width D of the inter-wire separation regions 13A may be varied according to both the intervals of the metallic wires 51 and the potential differences among the metallic wires 51.

Further, for example, the materials and thicknesses of the layers described in the above embodiments or the film forming methods and conditions in forming the layers are not limited to the above-mentioned, and other materials and thicknesses or other film forming methods and conditions may be adopted.

In addition, while the configurations of the organic light emitting devices 110R, 110G, 110B have been described specifically in the above embodiments, it is not necessary to provide all the above-mentioned layers, and other layers may further be provided.

Besides, while the case where the driving panel 10 and the inorganic insulating film 40 and the seal panel 20 are adhered to each other through the adhesive layer 30 formed therebetween over the whole area has been described in the above embodiments, the present invention is applicable also to the cases where the driving panel 10 and the seal panel 20 are only partly formed with the adhesive layer 30, for example, the case where the adhesive layer is formed only at peripheral edge parts of the driving panel 10 and the seal panel 20 and the like are adhered thereto.

In addition, the present invention is applicable not only to the display apparatus using the organic light emitting devices but also to display devices using other display devices, such as inorganic electroluminescence devices, liquid crystal display devices, electrodeposition type or electrochromic type display devices, etc.

It should be understood by those skilled in the art that various modifications, combinations, sub-combinations and alternations may occur depending on design requirements and other factors insofar as they are within the scope of the appended claims or the equivalent thereof.

What is claimed is:

1. A display apparatus comprising;
a driving panel;
a seal panel; and
an adhesive layer between the seal panel and the driving panel,
wherein,
the driving panel includes a substrate, a circuit part, a coating layer and a display part, the display part having a plurality of display devices, the circuit part, coating layer and display part layered on the substrate in that order,
the display apparatus has an adhesion region which includes the circuit part, the coating layer and the display part, the adhesive layer and the seal panel,
the display apparatus has a terminal region which includes a portion of each of the substrate, the circuit part and the coating layer extending outside of the adhesion region,
a plurality of metallic wires are electrically connected to the circuit part in said adhesion region and extend out therefrom into the terminal region,
the coating layer covers a portion of each of the metallic wires extending into the terminal region,
the coating layer includes at least one elongated opening between adjacent metallic wires,
the at least one elongated opening of the coating layer extends into both the adhesion region and the terminal region and is formed such that an end edge thereof lies in the terminal region but does not to reach an end edge of the terminal region.

2. The display apparatus as set forth in claim 1, wherein the coating layer includes an organic material.

3. The display apparatus as set forth in claim 1, wherein the coating layer includes a photosensitive material.

4. The display apparatus as set forth in claim 1, wherein the coating layer covers upper surfaces and side surfaces of the plurality of metallic wires.

5. The display apparatus as set forth in claim 1, further comprising an inorganic insulating film between the driving panel and the adhesive layer.

6. The display apparatus as set forth in claim 5, wherein: said within the adhesive region, the inorganic insulating film is in contact with the driving substrate in areas between the plurality of metallic wires, and the driving substrate includes an inorganic material including a glass.

7. The display apparatus as set forth in claim 1, wherein the width of the at least one elongated opening of the coating layer on either one of the distance and the potential difference between two metallic wires adjacent to each other through said separated region therebetween.

8. The display apparatus as set forth in claim 1, wherein the display device is an organic light emitting device which is so configured that a first electrode, an organic layer inclusive of a light emitting layer, and a second electrode are stacked in this order from the driving substrate, and light generated in the light emitting layer is taken out through the second electrode.

9. The display apparatus as set forth in claim 1, wherein the end edge of the at least one elongated opening in terminal region does not reach an end edge of said coating layer.

10. The display apparatus as set forth in claim 9, wherein a flat region in which an upper surface of said coating layer constitutes a flat surface in the array direction of terminals is secured between said end edge of said at least one elongated opening of said coating layer and said end edge of said coating layer.

11. The display apparatus as set forth in claim 9, wherein, in cross-section view, the coating layer is formed in a tapered shape such that a tip thereof has a size of not more than a resolution limit in forming said separated region.

12. The display apparatus as set forth in claim 9, wherein, in cross-sectional view, each elongated opening is defined by walls with all having vertex angles which are obtuse angles.

13. The display apparatus as set forth in claim 1, comprising such an elongated opening in the coating layer between each pair of adjacent metallic wirings.

14. A method of manufacturing a display apparatus comprising the steps of:
providing an adhesion region and a terminal region on a driving panel, forming a circuit part in said adhesion region and forming a plurality of wires extended from said circuit part into said terminal region;

forming a coating layer covering said circuit part so that an end edge thereof does not reach an end edge of said terminal region;

providing elongated openings in said coating layer between adjacent ones of said plurality of wires so that an end edge of each of said elongated openings lies beyond said adhesion region to reach said terminal region but not to reach an end edge of said coating layer, thereby forming a flat region in which an upper surface of said coating layer constitutes a flat surface in the array direction of terminals, between said end edges of said elongated openings and said end edge of said coating layer;

forming a display part over said coating layer in said adhesion region;

covering an upper side of said coating layer in said terminal region with masking tape, and putting said flat surface and said masking tape into full contact with each other;

adhering a seal panel to said adhesion region through an adhesive layer therebetween; and cutting away said seal panel and said adhesive layer in said terminal region and removing said masking tape to thereby expose said wires.

* * * * *

UNITED STATES PATENT AND TRADEMARK OFFICE
CERTIFICATE OF CORRECTION

PATENT NO. : 8,144,140 B2
APPLICATION NO. : 12/135620
DATED : March 27, 2012
INVENTOR(S) : Tomotaka Nishikawa et al.

Page 1 of 1

It is certified that error appears in the above-identified patent and that said Letters Patent is hereby corrected as shown below:

On the Title page of the patent:

The Foreign Application Priority Data is missing. Please add:

--(30) Foreign Application Priority Data

Jun. 13, 2007 (JP) 2007-156535
    Jun. 28, 2007 (JP) 2007-170145--

Signed and Sealed this
Fifth Day of June, 2012

David J. Kappos
*Director of the United States Patent and Trademark Office*